United States Patent
Miyamoto

(10) Patent No.: US 10,251,283 B2
(45) Date of Patent: Apr. 2, 2019

(54) CARRIER-ATTACHED COPPER FOIL, LAMINATE, METHOD FOR PRODUCING PRINTED WIRING BOARD, AND METHOD FOR PRODUCING ELECTRONIC DEVICE

(71) Applicant: JX Nippon Mining & Metals Corporation, Tokyo (JP)

(72) Inventor: Nobuaki Miyamoto, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 140 days.

(21) Appl. No.: 15/229,203

(22) Filed: Aug. 5, 2016

(65) Prior Publication Data
US 2017/0042044 A1    Feb. 9, 2017

(30) Foreign Application Priority Data
Aug. 6, 2015    (JP) .................... 2015-156528

(51) Int. Cl.
*H05K 1/09*    (2006.01)
*H05K 3/46*    (2006.01)
(Continued)

(52) U.S. Cl.
CPC ............ *H05K 3/4682* (2013.01); *H05K 1/09* (2013.01); *H05K 3/025* (2013.01); *H05K 3/108* (2013.01);
(Continued)

(58) Field of Classification Search
CPC .......... H05K 1/09; H05K 3/025; H05K 3/108; H05K 3/4611; H05K 3/4661;
(Continued)

(56) References Cited

U.S. PATENT DOCUMENTS

| 5,431,803 A | 7/1995 | DiFranco et al. |
| 7,026,059 B2 | 4/2006 | Suzuki et al. |

(Continued)

FOREIGN PATENT DOCUMENTS

| CN | 104125711 | 10/2014 | | |
| EP | 1152070 A1 * | 11/2001 | ............... | C25D 1/04 |

(Continued)

OTHER PUBLICATIONS

Final rejection dated Mar. 12, 2018 in co-pending U.S. Appl. No. 15/218,466.
(Continued)

*Primary Examiner* — David Sample
*Assistant Examiner* — Elizabeth Collister
(74) *Attorney, Agent, or Firm* — Nields, Lemack & Frame, LLC

(57) ABSTRACT

Provided herein is a carrier-attached copper foil having desirable fine circuit formability. The carrier-attached copper foil includes a carrier, an interlayer, and an ultrathin copper layer in this order, wherein D2−D1 is 0.30 to 3.83 μm, where D1 is the gravimetrically measured thickness of the carrier-attached copper foil excluding the carrier and the interlayer, and D2 is the maximum thickness of the layer remaining on a bismaleimide-triazine resin substrate in case of detaching the carrier after the carrier-attached copper foil is laminated to the resin substrate from the ultrathin copper layer side by being heat pressed under a pressure of 20 kgf/cm² at 220° C. for 2 hours.

23 Claims, 5 Drawing Sheets

(51) Int. Cl.
  *H05K 3/02* (2006.01)
  *H05K 3/10* (2006.01)
  *H05K 3/00* (2006.01)

(52) U.S. Cl.
  CPC ......... *H05K 3/4611* (2013.01); *H05K 3/4661* (2013.01); *H05K 3/007* (2013.01); *H05K 3/0035* (2013.01); *H05K 2201/0355* (2013.01); *H05K 2203/0307* (2013.01); *H05K 2203/0376* (2013.01); *H05K 2203/0384* (2013.01); *H05K 2203/06* (2013.01)

(58) Field of Classification Search
  CPC ......... H05K 3/4682; H05K 2201/0355; H05K 2203/0307; H05K 2203/0376; H05K 2203/0384; H05K 2203/06; H05K 3/0035; H05K 3/007; H05K 1/11; H05K 3/02; H05K 3/42
  See application file for complete search history.

(56) References Cited

U.S. PATENT DOCUMENTS

| | | | |
|---|---|---|---|
| 9,955,583 B2 | 4/2018 | Ishii et al. | |
| 10,123,433 B2 | 11/2018 | Moriyama et al. | |
| 2001/0042732 A1 | 11/2001 | Yamamoto et al. | |
| 2003/0148136 A1* | 8/2003 | Yamamoto | C25D 1/04 428/607 |
| 2004/0038049 A1 | 2/2004 | Suzuki et al. | |
| 2004/0067377 A1* | 4/2004 | Sugimoto | B32B 7/06 428/469 |
| 2004/0241487 A1 | 12/2004 | Nagatani | |
| 2005/0048306 A1 | 3/2005 | Suzuki et al. | |
| 2005/0158574 A1 | 7/2005 | Suzuki et al. | |
| 2010/0084275 A1 | 4/2010 | Hanafusa | |
| 2011/0262764 A1 | 10/2011 | Arai et al. | |
| 2011/0311834 A1 | 12/2011 | Hanafusa | |
| 2012/0285734 A1 | 11/2012 | Uno et al. | |
| 2013/0220679 A1 | 8/2013 | Kawakami | |
| 2016/0183380 A1 | 6/2016 | Ishii et al. | |
| 2017/0019991 A1 | 1/2017 | Miyamoto et al. | |
| 2017/0032978 A1 | 2/2017 | Moriyama et al. | |
| 2017/0034926 A1 | 2/2017 | Moriyama et al. | |
| 2017/0042025 A1 | 2/2017 | Miyamoto | |
| 2017/0042036 A1 | 2/2017 | Miyamoto | |
| 2018/0279482 A1 | 9/2018 | Ishii et al. | |

FOREIGN PATENT DOCUMENTS

| | | |
|---|---|---|
| JP | 3261119 B2 | 2/2002 |
| JP | 2005-161840 A | 6/2005 |
| JP | 2006-22406 A | 1/2006 |
| JP | 2006-346874 A | 12/2006 |
| JP | 2007-7937 A | 1/2007 |
| JP | 2010-6071 A | 1/2010 |
| JP | 5352748 B1 | 11/2013 |
| JP | 2014-100905 A | 6/2014 |
| JP | 2014-131808 A | 7/2014 |
| JP | 2014-208910 A | 11/2014 |
| JP | 2015-42765 A | 3/2015 |
| JP | 2015-61938 A | 4/2015 |
| JP | 2016-89193 A | 5/2016 |
| KR | 2014-0053797 A | 5/2014 |
| TW | 201446488 A | 12/2014 |
| WO | 2004/005588 A1 | 1/2004 |
| WO | 2012/046804 A1 | 4/2012 |
| WO | 2014/065430 A1 | 5/2014 |
| WO | 2014/196576 A1 | 12/2014 |
| WO | 2015/012327 A1 | 1/2015 |
| WO | 2015/108191 A1 | 7/2015 |

OTHER PUBLICATIONS

Office action dated Jan. 24, 2018 in co-pending U.S. Appl. No. 15/218,449.
Office action mailed Aug. 25, 2017 in co-pending U.S. Appl. No. 15/218,466.
Office action dated Nov. 15, 2017 in co-pending U.S. Appl. No. 15/218,466.
Office action dated Sep. 25, 2018 in co-pending U.S. Appl. No. 15/209,930.
Notice of allowance dated Oct. 31, 2018 in co-pending U.S. Appl. No. 15/218,466.
Office action mailed Nov. 2, 2018 in co-pending U.S. Appl. No. 15/229,197.
Notice of allowance dated Jun. 25, 2018 in co-pending U.S. Appl. No. 15/218,449.
Notice of allowance dated Jun. 25, 2018 in co-pending U.S. Appl. No. 15/218,466.
Office action dated Jun. 15, 2018 in co-pending U.S. Appl. No. 15/229,194.
Office action dated Jul. 11, 2018 in co-pending U.S. Appl. No. 15/229,197.
Office action dated Mar. 26, 2018 in co-pending U.S. Appl. No. 15/209,930.

* cited by examiner

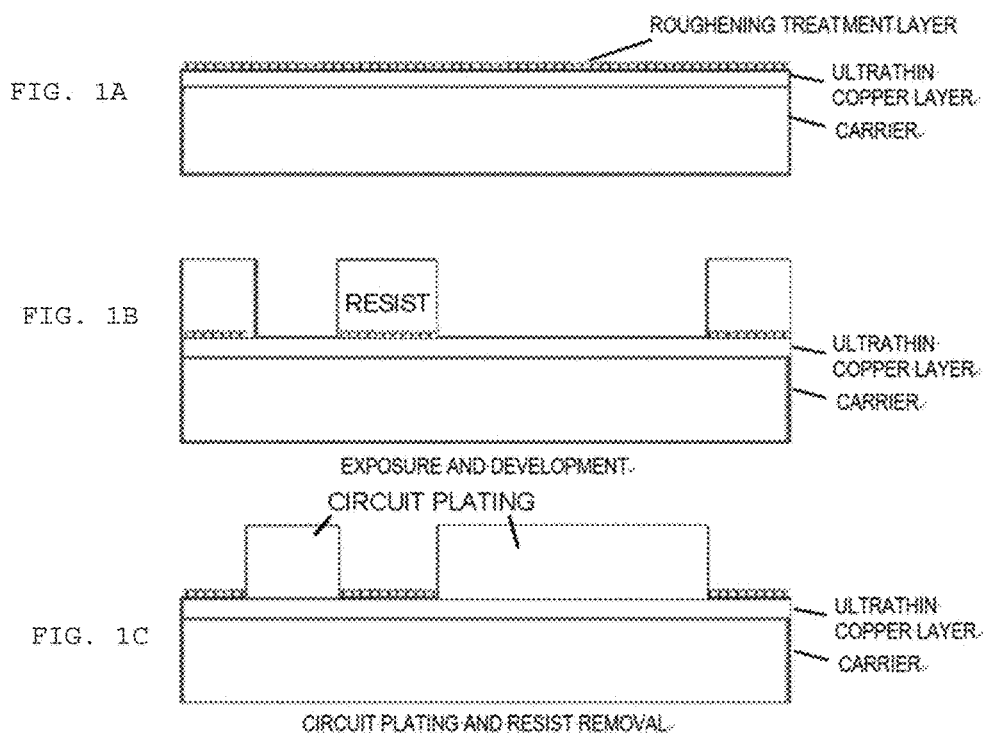

LAMINATE OF RESIN AND COPPER FOIL WITH CARRIER

SECOND-LAYER CARRIER FOIL RELEASE

LASER HOLE DRILLING

VIA FILL

SECOND-LAYER CIRCUIT PLATING

FIRST-LAYER CARRIER-FOIL RELEASE

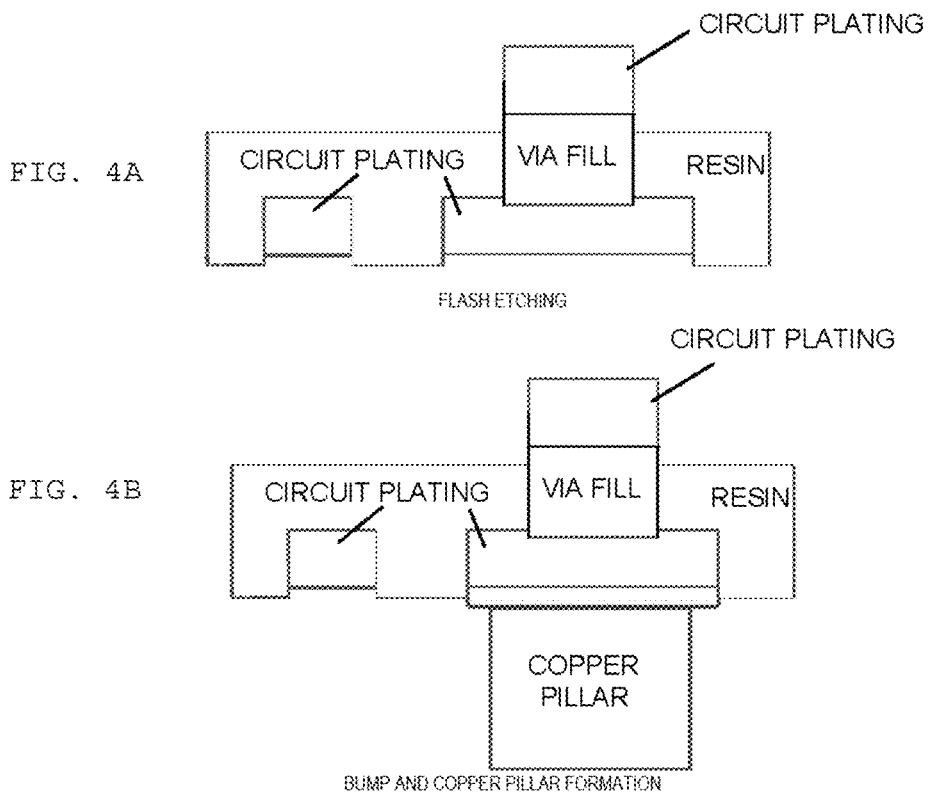
FIG. 4A
FIG. 4B
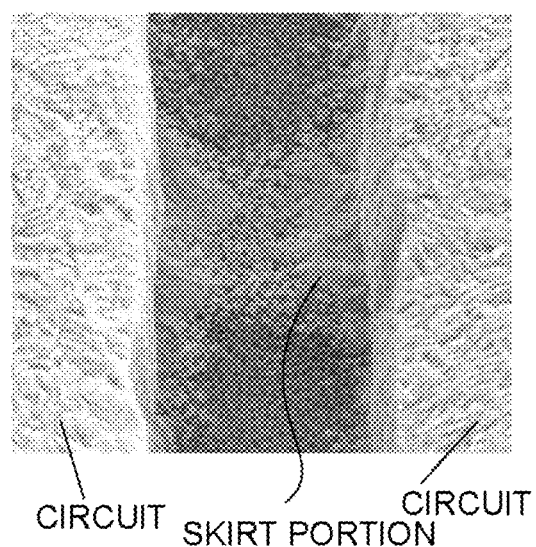
FIG.5

CARRIER-ATTACHED COPPER FOIL, LAMINATE, METHOD FOR PRODUCING PRINTED WIRING BOARD, AND METHOD FOR PRODUCING ELECTRONIC DEVICE

BACKGROUND OF THE INVENTION

Field of the Invention

The present invention relates to a carrier-attached copper foil, a laminate, a method for producing a printed wiring board, and a method for producing an electronic device.

A printed wiring board is typically produced through processes that involve bonding an insulating substrate to a copper foil to produce a copper-clad laminated board, and forming a conductor pattern by etching the copper foil surface. As miniaturization of electronic devices continues and the need for higher performance increases, there has been progress in the development of a high-density mounting technique for mounting components, and a technique for achieving high signal frequency. This has created new requirements for printed wiring boards, including fine (fine pitch) conductor patterns, or accommodation of high frequencies.

In order to meet the fine pitch requirement, a copper foil having a thickness of 9 μm or less, or a smaller thickness as thin as 5 μm or less is needed. Such ultrathin copper foils have poor mechanical strength, and easily break or produce wrinkles during production of a printed wiring board, and there has been an emergence of a carrier-attached copper foil that uses a thick metal foil as a carrier, and in which an ultrathin copper layer is electrodeposited on the carrier via a release layer. The ultrathin copper layer is laminated to an insulating substrate, and, after the thermocompression of these two layers, the carrier is released and removed via the release layer. A fine circuit is formed by using a technique (MSAP: Modified-Semi-Additive-Process) that etches and removes the ultrathin copper layer with a sulfuric acid-hydrogen peroxide-based etchant after forming a circuit pattern with a resist on the exposed surface of the ultrathin copper layer.

The resin bonding surface of the ultrathin copper layer in the carrier-attached copper foil mainly needs to have sufficient peel strength between the ultrathin copper layer and the resin base, and the peel strength needs to be sufficiently remain even after treatments and processes, such as high-temperature heating, wet processes, soldering, and chemical treatments. In a typical method of improving the peel strength between the ultrathin copper layer and the resin base, large numbers of roughening particles are attached to the ultrathin copper layer after creating a large surface profile (irregularities, roughness) on the ultrathin copper layer.

However, a problem occurs when such an ultrathin copper layer having a large profile (irregularities, roughness) is used for a semiconductor package substrate, which requires a particularly fine circuit pattern compared to other printed wiring boards. Specifically, unwanted copper particles remain after etching the circuit, and this causes problems such as insulation failure between circuit patterns.

WO2004/005588 discloses a carrier-attached copper foil for fine circuits, including semiconductor package substrates. Specifically, this publication attempts to use a carrier-attached copper foil that is produced without roughening a surface of an ultrathin copper layer. Because of its low profile (irregularities, degree of roughness, roughness), the unroughened ultrathin copper layer tends to have poorer adhesion (peel strength) for resin than a common copper foil for printed wiring boards. This carrier-attached copper foil thus needs further improvements.

The previous efforts to develop a carrier-attached copper foil had a primary focus on the peel strength between an ultrathin copper layer and a resin base. For this reason, there are not many studies concerning a carrier-attached copper foil that is desirable for fine circuit formation and suited for high-density mounting on a printed wiring board, and there is a room for further improvements.

SUMMARY OF THE INVENTION

It is accordingly an object of the present invention to provide a carrier-attached copper foil having desirable fine circuit formability.

Concerning a carrier-attached copper foil suited for fine circuit formation, it is contemplated to improve the surface smoothness of the carrier-attached copper foil on the ultrathin copper layer side, or to form fine roughening particles. The present inventors went further, and conducted the following investigations.

Specifically, it was found that skillfully reducing the flash etching time in circuit formation was important to further improve fine circuit formability, and that reducing the "thickness range of the layer to be subjected to circuit formation" was effective to this end. Here, "thickness range of the layer to be subjected to circuit formation" means either the maximum thickness range of the carrier and the ultrathin copper layer (bulk) due to undulations in the bulk, or, when roughening particles are formed on the ultrathin copper layer, the maximum thickness range including undulations in the bulk, and the leg lengths of roughening nodules formed on the ultrathin copper layer.

The present inventors conducted extensive studies to reduce the thickness range of the layer to be subjected to circuit formation, and found that the thickness range of the layer to be subjected to circuit formation can be reduced, and desirable fine circuit formability can be obtained when the thickness difference obtained by subtracting the gravimetrically measured thickness of a carrier-attached copper foil excluding the carrier and the interlayer from the maximum thickness of the layer remaining on a resin substrate in case of detaching the carrier after the carrier-attached copper foil is laminated to the resin substrate from the ultrathin copper layer side is controlled within a predetermined range.

The present invention was completed on the basis of this finding, and an aspect of the invention is a carrier-attached copper foil including a carrier, an interlayer, and an ultrathin copper layer in this order, wherein D2−D1 is 0.30 to 3.83 μm, where D1 is the gravimetrically measured thickness of the carrier-attached copper foil excluding the carrier and the interlayer, and D2 is the maximum thickness of the layer remaining on a bismaleimide-triazine resin substrate in case of detaching the carrier after the carrier-attached copper foil is laminated to the resin substrate from the ultrathin copper layer side by being heat pressed under a pressure of 20 kgf/cm$^2$ at 220° C. for 2 hours.

In an embodiment of the carrier-attached copper foil of the present invention, the difference D2−D1 is 3.50 μm or less. In another embodiment of the carrier-attached copper foil of the present invention, the difference D2−D1 is 2.80 μm or less.

In another embodiment of the carrier-attached copper foil of the present invention, the difference D2−D1 is 2.58 μm or less.

In yet another embodiment of the carrier-attached copper foil of the present invention, the difference D2−D1 is 1.20 µm or less.

In an embodiment of the carrier-attached copper foil of the present invention, the carrier-attached copper foil comprises one or more layers selected from the group consisting of a roughening treatment layer, a heat-resistant layer, an antirust layer, a chromate treatment layer, and a silane coupling process layer, said one or more layers being provided on one or both of the surfaces on the side of the ultrathin copper layer and on the side of the carrier when the carrier-attached copper foil of the present invention has the interlayer and the ultrathin copper layer in this order seen from the carrier, on one side of the surfaces of the carrier, said one or more layers being provided on one or both surfaces on the ultrathin copper layer side when the carrier-attached copper foil of the present invention has the interlayer and the ultrathin copper layer in this order seen from the carrier, on the both surfaces of the carrier.

In another embodiment of the carrier-attached copper foil of the present invention, the roughening treatment layer is a layer comprised of a simple substance selected from the group consisting of copper, nickel, phosphorous, tungsten, arsenic, molybdenum, chromium, iron, vanadium, cobalt, and zinc, or an alloy containing one or more simple substances selected from the group consisting of copper, nickel, phosphorous, tungsten, arsenic, molybdenum, chromium, iron, vanadium, cobalt, and zinc.

In yet another embodiment of the carrier-attached copper foil of the present invention, a resin layer is provided on the ultrathin copper layer.

In still another embodiment of the carrier-attached copper foil of the present invention, the resin layer is provided on one or more layers selected from the group consisting of a roughening treatment layer, a heat-resistant layer, an antirust layer, a chromate treatment layer, and a silane coupling process layer.

Another aspect of the present invention is a laminate produced by using the carrier-attached copper foil of the embodiment of the invention.

Yet another aspect of the present invention is a laminate including the carrier-attached copper foil of the embodiment of the invention, and a resin, wherein the resin covers end surfaces of the carrier-attached copper foil either in part or as a whole.

Still another aspect of the present invention is a laminate comprising a first carrier-attached copper foil laminated from the carrier side or the ultrathin copper layer side to the carrier side or the ultrathin copper layer side of a second carrier-attached copper foil, the first and the second carrier-attached copper foils being the carrier-attached copper foil of the embodiment of the invention.

Yet another aspect of the present invention is a method for producing a printed wiring board by using the laminate of the embodiment of the invention.

Still another aspect of the present invention is a method for producing a printed wiring board, the method comprising:

providing a dual layer of resin layer and circuit at least once one side or both sides of the laminate of the embodiment of the invention; and detaching the ultrathin copper layer or the carrier from the carrier-attached copper foil included in the laminate after the dual layer of resin layer and circuit is formed at least once.

Yet another aspect of the present invention is a method for producing a method for producing a printed wiring board by using the carrier-attached copper foil of the embodiment of the invention.

Still another aspect of the present invention is a method for producing an electronic device by using a printed wiring board produced by using the method of the embodiment of the invention.

Yet another aspect of the present invention is a method for producing a printed wiring board, the method comprising:

preparing the carrier-attached copper foil of the embodiment of the invention, and an insulating substrate;

laminating the carrier-attached copper foil and the insulating substrate to each other;

forming a copper-clad laminated board by detaching the carrier of the carrier-attached copper foil after the carrier-attached copper foil and the insulating substrate are laminated to each other; and forming a circuit by using any of a semi-additive process, a subtractive process, a partly additive process, and a modified semi-additive process.

Still another aspect of the present invention is a method for producing a printed wiring board, the method comprising:

forming a circuit on the surface of the carrier-attached copper foil of the embodiment of the invention on the side of the ultrathin copper layer or on the side of the carrier;

forming a resin layer on the ultrathin copper layer- or carrier-side surface of the carrier-attached copper foil so as to make the circuit embedded in the resin layer;

detaching the carrier or the ultrathin copper layer; and removing the ultrathin copper layer or the carrier after detaching the carrier or the ultrathin copper layer to expose the circuit formed on the ultrathin copper layer- or carrier-side surface and embedded in the resin layer.

Yet another aspect of the present invention is a method for producing a printed wiring board, the method comprising:

laminating the surface of the carrier-attached copper foil of the embodiment of the invention to a resin substrate on the side of the ultrathin copper layer, or on the side of the carrier;

providing a dual layer of resin layer and circuit at least once on the ultrathin copper layer- or carrier-side surface of the carrier-attached copper foil opposite the surface laminated to the resin substrate; and detaching the carrier or the ultrathin copper layer from the carrier-attached copper foil after the formation of the dual layer of resin layer and circuit.

The present invention can provide a carrier-attached copper foil having desirable fine circuit formability.

BRIEF DESCRIPTION OF THE DRAWINGS

FIGS. 1A, 1B and 1C are schematic views representing a wiring board cross section in processes from circuit plating to resist removal according to a specific example of a printed wiring board producing method using a carrier-attached copper foil of an embodiment of the present invention.

FIGS. 4A and 4B are schematic views representing a wiring board cross section in processes from flash etching to formation of a bump and a copper pillar according to a specific example of the printed wiring board producing method using a carrier-attached copper foil of an embodiment of the present invention.

FIG. 5 is a schematic view representing a cross section of a circuit showing a skirt portion according to Example.

DESCRIPTION OF THE PREFERRED EMBODIMENTS

Carrier-Attached Copper Foil

Figure 2A:
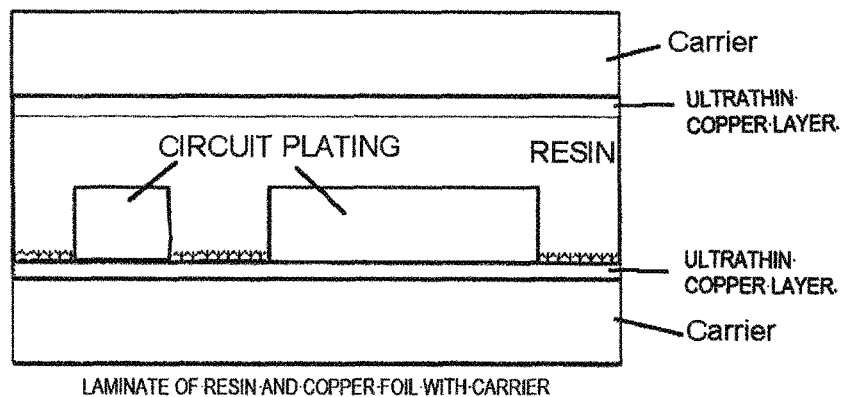
FIGS. 2A, 2B and 2C are schematic views representing a wiring board cross section in processes from lamination of a resin and a second carrier-attached copper foil layer to laser drilling according to a specific example of the printed wiring board producing method using a carrier-attached copper foil of an embodiment of the present invention.

A carrier-attached copper foil of an embodiment of the present invention includes a carrier, an interlayer, and an ultrathin copper layer, in this order. The carrier-attached copper foil itself may be used according to a known method. For example, a printed wiring board may be produced as follows. The surface of the ultrathin copper layer is laminated to an insulating substrate such as a paper base phenolic resin, a paper base epoxy resin, a synthetic fiber fabric base epoxy resin, a glass fabric-paper composite base epoxy resin, a glass fabric-glass nonwoven fabric composite base epoxy resin, a glass fabric base epoxy resin, a polyester film, and a polyimide film.

After thermocompression, the carrier is detached, and the ultrathin copper layer bonded to the insulating substrate is etched into a desired conductor pattern. The carrier-attached copper foil may include the interlayer and the ultrathin copper layer on one surface of the carrier, in this order, and a roughening treatment layer (described later) may be provided on the carrier surface opposite the ultrathin copper layer side. The carrier-attached copper foil may include the interlayer and the ultrathin copper layer on the both surfaces of the carrier, in this order.

Maximum Thickness Value of Layer to be Subjected to Circuit Formation

In order to further improve fine circuit formability from the related art, skillfully reducing the flash etching time in circuit formation is important, and reducing the "maximum thickness value of the layer to be subjected to circuit formation" is effective to this end. Here, "maximum thickness value of the layer to be subjected to circuit formation" means either the maximum thickness of the ultrathin copper layer (bulk) due to undulations in the carrier and the bulk, or, when roughening particles are formed on the ultrathin copper layer, the maximum thickness including undulations in the bulk, and the leg lengths of roughening nodules formed on the ultrathin copper layer.

The present invention is concerned with a carrier-attached copper foil in which D2−D1 is 0.30 to 3.83 μm, where D1 is the gravimetrically measured thickness (μm) of the carrier-attached copper foil excluding the carrier and the interlayer, and D2 is the maximum thickness of the layer remaining on a bismaleimide-triazine resin substrate in case of detaching the carrier after the carrier-attached copper foil is laminated to the resin substrate from the ultrathin copper layer side by being heat pressed under a pressure of 20 kgf/cm$^2$ at 220° C. for 2 hours. With this configuration, the thickness range of the layer to be subjected to circuit formation can be controlled to decrease, and desirable fine circuit formability can be achieved. A problem occurs when the difference D2−D1 is less than 0.30 μm. Specifically, the adhesion for the resin becomes poor, causing the wires to easily come off. When the difference D2−D1 exceeds 3.83 μm, the time required for flash etching increases as the thickness range increases. Here, if the circuit wire width were to be maintained, the longer leg portions of roughening particles remain as residues when roughening particles are formed, or circuit skirting increases. When the etching time is increased to completely remove the copper residue, fine circuit formability suffers as the wire width becomes narrower, and the wires fail to have a desired line/space ratio. The difference D2−D1 may be 0.4 μm or more, 0.5 μm or more, 0.6 μm or more, 0.7 μm or more, and is preferably 3.8 μm or less, 3.5 μm or less, 3.0 μm or less, 2.8 μm or less, 2.58 μm or less, 2.5 μm or less, or 1.2 μm or less.

The gravimetrically measured thickness (D1) of the carrier-attached copper foil excluding the carrier and the interlayer refers to the gravimetrically measured total thickness of the ultrathin copper layer and a surface treatment layer, for example, when a surface treatment layer such as a roughening treatment layer, and a heat-resistant layer is formed on the ultrathin copper layer. The maximum thickness (D2) of the layer remaining on the resin substrate refers to the maximum value of the difference between the highest point and the lowest point of the layer remaining on the resin substrate (the thickness of the thickest portion) as observed relative to a horizontal plane after the carrier is detached. The layer remaining on the resin substrate refers to a layer configured from the ultrathin copper layer remaining on the resin substrate, and a surface treatment layer, for example, when a surface treatment layer such as a roughening treatment layer, and a heat-resistant layer is formed on the ultrathin copper layer of the carrier-attached copper foil.

Carrier

The carrier that is usable in the present invention is typically a metal foil or a resin film, and is provided in the form of, for example, a copper foil, a copper alloy foil, a nickel foil, a nickel alloy foil, an iron foil, an iron alloy foil, a stainless steel foil, an aluminum foil, an aluminum alloy foil, an insulating resin film, a polyimide film, an LCP (liquid crystal polymer) film, a fluororesin film, a polyamide film, and a PET film.

The carrier that is usable in the present invention is typically provided in the form of a press-rolled copper foil, or an electrolytic copper foil. Typically, an electrolytic copper foil is produced by electrolytic deposition of copper on a titanium or stainless steel drum from a copper sulfate plating bath. A press-rolled copper foil is typically produced by repeating plastic working by pressure rolls, and a heat treatment. The copper foil material may be a high-purity copper material, for example, such as tough pitch copper (JIS H3100 alloy No. C1100), and oxygen-free copper (JIS H3100 alloy No. C1020, or JIS H3510 alloy No. C1011). The copper foil material also may be a copper alloy material, for example, such as Sn-containing copper, Ag-containing copper, a copper alloy containing elements such as Cr, Zr, and Mg, and a Corson copper alloy containing Ni and Si. As used herein, the term "copper foil", when used by itself, is inclusive of "copper alloy foil."

The thickness of the carrier usable in the present invention is not particularly limited either, and the carrier may have any thickness, for example, 5 μm or more, as long as it is appropriately adjusted to a thickness suited as a carrier. However, typically, the carrier thickness is preferably 35 µm or less because the production cost increases when it is too thick. Taken together, the carrier thickness is typically 8 to 70 µm, more typically 12 to 70 µm, further typically 18 to 35 µm. From the standpoint of reducing the raw material cost, it is preferable to make the carrier as thin as possible. For these reasons, the carrier thickness is typically 5 µm to 35 µm, preferably 5 µm to 18 µm, preferably 5 µm to 12 µm, preferably 5 µm to 11 µm, preferably 5 µm to 10 µm. When the carrier is thin, a crease tends to generate while the carrier passes through machinery for processing. Crease generation can be effectively prevented by, for example, smoothing the conveyer roll of a carrier-attached copper foil manufacturing apparatus, or making the distance between the adjacent conveyer rolls shorter. The carrier needs to have high rigidity when the carrier-attached copper foil is used in an embedded process, a technique used in a printed wiring board producing method. When using an embedded process, it is therefore preferable that the carrier thickness be 18 µm to 300 µm, 25 µm to 150 µm, 35 µm to 100 µm, more preferably 35 µm to 70 µm.

A roughening treatment layer may be provided on the carrier surface opposite the surface provided with the ultrathin copper layer. The roughening treatment layer may be provided by using a known method, or by performing the roughening treatment described below. It is advantageous to provide the roughening treatment layer on the carrier surface opposite the surface provided with the ultrathin copper layer because it makes the carrier less likely to detach itself from a resin substrate when the carrier is laminated to a support such as a resin substrate on the side having the roughening treatment layer.

The difference D2−D1 between the gravimetrically measured thickness of the carrier-attached copper foil of the present invention excluding the carrier and the interlayer, and the maximum thickness of the layer remaining on the resin substrate in case of detaching the carrier after the carrier-attached copper foil is laminated to the resin substrate can be controlled by adjusting the surface form of the carrier on the side of the ultrathin copper layer. The carrier of the present invention may be fabricated by using any of the following fabrication methods A to K.

Carrier Fabrication Method A

A smooth polyimide film is prepared. The smooth polyimide film may be, for example, a Upilex (manufactured by Ube Industries Ltd.), a Kapton (manufactured by DuPont/Toray-Du Pont), or an Apical (manufactured by Kaneka). Preferably, the smooth polyimide film is a BPDA-based or BPDA-PPD-based polyimide film, or a PMDA-based or PMDA-ODA-based polyimide film. Here, BPDA means biphenyltetracarboxylic dianhydride, PPD means p-phenylenediamine, PMDA means pyromellitic acid anhydride, and ODA means 4,4'-diaminodiphenyl ether. The smooth polyimide film is subjected to a plasma treatment to remove surface contaminants, and to alter the surface. A polyimide film of a desired surface shape can be obtained by performing a plasma treatment under predetermined conditions after finding relationships between plasma treatment conditions and surface shape.

Here, the ten-point mean roughness Rz (JIS B0601 1994) of the smooth polyimide film on the surface to be provided with the ultrathin copper layer is 0.5 to 18 nm before plasma treatment, and 2.5 to 20 nm after plasma treatment.

For example, the surface roughness Rz increases with increase of plasma power in a plasma treatment. The plasma treatment is performed as follows. Specifically, a polyimide film is set inside a vacuum device. After vacuum evacuation, oxygen is introduced into the chamber, and the chamber pressure is adjusted to 5 to 12 Pa. The plasma treatment is then performed at 100 to 200 W for 20 to 40 seconds.

The surface roughness measurement before and after the plasma treatment may be performed using the device below under the following measurement conditions.
Device: Shimadzu Corporation scanning probe microscope SPM-9600
Conditions: Dynamic mode
Scan range: 1 µm×1 µm
Number of pixels: 512×512

Carrier Fabrication Method B

A titanium rotary drum (electrolytic drum) is prepared. The surface of the electrolytic drum is ground under specific electrolytic drum surface control conditions with an abrasive wheel grinding material of a grain size #3000 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.
Electrolytic Solution Composition
  Copper: 80 to 110 g/L
  Sulfuric acid: 70 to 110 g/L
  Chlorine: 10 to 100 mass ppm
Fabrication Conditions
  Current density: 50 to 200 A/dm$^2$
  Electrolytic solution temperature: 40 to 70° C.
  Electrolytic solution linear velocity: 3 to 5 m/sec
  Electrolysis time: 0.5 to 10 min The copper deposited on the surface of the rotating electrolytic drum is scraped off, and used as the carrier. The interlayer is formed on the drum side of the electrolytic copper foil (the surface opposite the depositing surface; glossy surface side).

Carrier Fabrication Method C

The electrolytic copper foil is fabricated with the electrolytic solution below. The interlayer is formed on the depositing side of the electrolytic copper foil (the glossy surface opposite the drum side).
Electrolytic Solution Composition
  Copper: 90 to 110 g/L
  Sulfuric acid: 90 to 110 g/L
  Chlorine: 50 to 100 ppm
  Leveling agent 1: (bis(3-sulfopropyl)disulfide): 10 to 30 ppm
  Leveling agent 2 (amine compound): 10 to 30 ppm The amine compound may be an amine compound of the following chemical formula.

The remainder of the process solution used for processes such as electrolysis, surface treatment, and plating in the present invention is water, unless otherwise stated.

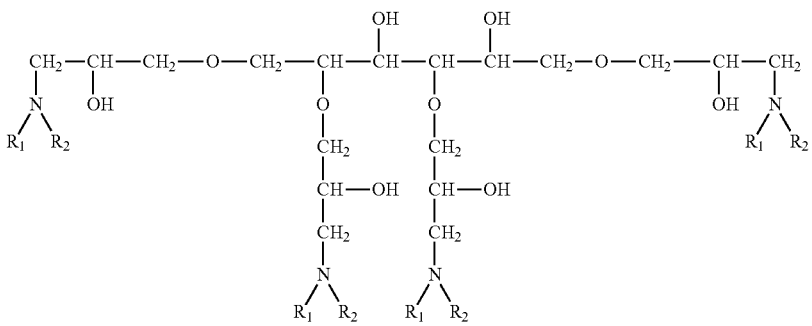

(1)

In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.

Fabrication Conditions
Current density: 70 to 100 A/dm²
Electrolytic solution temperature: 50 to 60° C.
Electrolytic solution linear velocity: 3 to 5 m/sec
Electrolysis time: 0.5 to 10 min Carrier Fabrication Method D A titanium rotary drum (electrolytic drum) is prepared. The surface of the electrolytic drum is ground under specific electrolytic drum surface control conditions with an abrasive wheel grinding material of a grain size #1000 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
Copper: 80 to 110 g/L
Sulfuric acid: 70 to 110 g/L
Chlorine: 10 to 100 mass ppm Fabrication Conditions
Current density: 50 to 200 A/dm²
Electrolytic solution temperature: 40 to 70° C.
Electrolytic solution linear velocity: 3 to 5 m/sec
Electrolysis time: 0.5 to 10 min The copper deposited on the surface of the rotating electrolytic drum is scraped off, and the glossy surface side is plated with a plating solution of the composition given in the carrier fabrication method C above. The interlayer is formed on the glossy surface side of the electrolytic copper foil.

Carrier Fabrication Method E

A titanium rotary drum (electrolytic drum) is prepared. The surface of the electrolytic drum is ground under specific electrolytic drum surface control conditions with an abrasive wheel grinding material of a grain size #1000 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
Copper: 80 to 110 g/L
Sulfuric acid: 70 to 110 g/L
Chlorine: 10 to 100 mass ppm Fabrication Conditions
Current density: 50 to 200 A/dm²
Electrolytic solution temperature: 40 to 70° C.
Electrolytic solution linear velocity: 3 to 5 m/sec
Electrolysis time: 0.5 to 10 min The copper deposited on the surface of the rotating electrolytic drum is scraped off, and surface treated with a hydrogen peroxide/sulfuric acid-based etchant on the glossy surface side to make a carrier. The surface treatment may be performed by, for example, spray etching under the following conditions.

Spray Etching Conditions
Type of etching: Spray etching
Spray nozzle: Full cone nozzle
Spray pressure: 0.10 MPa
Etchant temperature: 30° C.
Etchant composition:
Additive: a composition containing 10 w/v % of hydrogen peroxide and 2 w/v % of sulfuric acid, prepared by adding a predetermined amount of sulfuric acid to a 4× diluted solution of CPB-38 (manufactured by Mitsubishi Gas Chemical, Inc.; 35.0 w/w % (40 w/v %) hydrogen peroxide, and 3.0 w/w % (3.5 w/v %) sulfuric acid).

The interlayer is formed on the glossy surface side of the electrolytic copper foil.

Carrier Fabrication Method F

A copper ingot of a composition containing 1,200 wt ppm of Sn added to JIS-H3100 oxygen-free copper is produced, and subjected to hot rolling at 800 to 900° C. Annealing and cold rolling is then repeated once in a 300 to 700° C. continuous annealing line to obtain a 1 to 2 mm-thick rolled plate. The rolled plate is annealed in a 600 to 800° C. continuous annealing line to recrystallize, and subjected to the final cold rolling at the rolling reduction of 95 to 99.7% until the thickness became 7 to 50 μm. The resulting rolled copper foil is used as the carrier.

Here, the oil film equivalent is adjusted to 23,000 for both the final path of the final cold rolling, and the path immediately before the final path of final cold rolling. The oil film equivalent is represented by the following formula.

$$(\text{Oil film equivalent}) = \{(\text{rolling oil viscosity,kinetic viscosity at } 40° \text{ C.;cSt}) \times (\text{rolling velocity;m/min})\} / \{(\text{yield stress of material;kg/mm}^2) \times (\text{roll bite angle;rad})\}$$

Carrier Fabrication Method G

A titanium rotary drum (electrolytic drum) is prepared. The surface of the electrolytic drum is ground under specific electrolytic drum surface control conditions with an abrasive wheel grinding material of a grain size #1500 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
- Copper: 80 to 110 g/L
- Sulfuric acid: 70 to 110 g/L
- Chlorine: 10 to 100 mass ppm Fabrication Conditions
- Current density: 50 to 200 A/dm$^2$
- Electrolytic solution temperature: 40 to 70° C.
- Electrolytic solution linear velocity: 3 to 5 m/sec
- Electrolysis time: 0.5 to 10 min The copper deposited on the surface of the rotating electrolytic drum is scraped off, and used as the carrier. The interlayer is formed on the glossy surface side of the electrolytic copper foil.

Carrier Fabrication Method H

A titanium rotary drum (electrolytic drum) is prepared. The surface of the electrolytic drum is ground under specific electrolytic drum surface control conditions with an abrasive wheel grinding material of a grain size #1000 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
- Copper: 80 to 110 g/L
- Sulfuric acid: 70 to 110 g/L
- Chlorine: 10 to 100 mass ppm Fabrication Conditions
- Current density: 50 to 200 A/dm$^2$
- Electrolytic solution temperature: 40 to 70° C.
- Electrolytic solution linear velocity: 3 to 5 m/sec
- Electrolysis time: 0.5 to 10 min The copper deposited on the surface of the rotating electrolytic drum is scraped off, and used as the carrier. The interlayer is formed on the glossy surface side of the electrolytic copper foil.

Carrier Fabrication Method I

A titanium rotary drum (electrolytic drum) is prepared. The surface of the electrolytic drum is ground under specific electrolytic drum surface control conditions with an abrasive wheel grinding material of a grain size F500 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
- Copper: 80 to 110 g/L
- Sulfuric acid: 70 to 110 g/L
- Chlorine: 10 to 100 mass ppm Fabrication Conditions
- Current density: 50 to 200 A/dm$^2$
- Electrolytic solution temperature: 40 to 70° C.
- Electrolytic solution linear velocity: 3 to 5 m/sec
- Electrolysis time: 0.5 to 10 min The copper deposited on the surface of the rotating electrolytic drum is scraped off, and used as the carrier. The interlayer is formed on the glossy surface side of the electrolytic copper foil.

Carrier Fabrication Method J

A titanium rotary drum (electrolytic drum) is prepared. The surface of the electrolytic drum is ground under specific electrolytic drum surface control conditions with an abrasive wheel grinding material of a grain size F320 at a grinding stone rotation speed of 500 rpm. The electrolytic drum and electrodes are disposed inside an electrolysis vessel. The electrodes are disposed around the drum with a predetermined distance in between. Electrolysis is performed in the electrolysis vessel under the following conditions, whereby copper is deposited on the electrolytic drum surface while rotating the electrolytic drum.

Electrolytic Solution Composition
- Copper: 80 to 110 g/L
- Sulfuric acid: 70 to 110 g/L
- Chlorine: 10 to 100 mass ppm Fabrication Conditions
- Current density: 50 to 200 A/dm$^2$
- Electrolytic solution temperature: 40 to 70° C.
- Electrolytic solution linear velocity: 3 to 5 m/sec
- Electrolysis time: 0.5 to 10 min The copper deposited on the surface of the rotating electrolytic drum is scraped off, and used as the carrier. The interlayer is formed on the glossy surface side of the electrolytic copper foil.

Carrier Fabrication Method K

The electrolytic solution below is used to fabricate the electrolytic copper foil. The interlayer is formed on the matte surface side of the electrolytic copper foil (the depositing surface side; the surface opposite the drum side).

Electrolytic Solution Composition
- Copper: 70 to 130 g/L
- Sulfuric acid: 70 to 130 g/L
- Chlorine: 30 to 100 ppm
- Glue: 0.05 to 3 ppm Fabrication Conditions
- Current density: 70 to 100 A/dm$^2$
- Electrolytic solution temperature: 50 to 60° C.
- Electrolytic solution linear velocity: 3 to 5 m/sec
- Electrolysis time: 0.5 to 10 min Interlayer The interlayer is provided on one or both surfaces of the carrier. Other layers may be provided between the carrier and the interlayer. The interlayer used in the present invention is not particularly limited, as long as it has a configuration that does not easily allow the ultrathin copper layer to be detached from the carrier before the lamination of the carrier-attached copper foil to the insulating substrate, but allows the ultrathin copper layer to be detached from the carrier after the lamination to the insulating substrate. For example, the interlayer of the carrier-attached copper foil of the embodiment of the present invention may contain one or more selected from the group consisting of Cr, Ni, Co, Fe, Mo, Ti, W, P, Cu, Al, Zn, alloys thereof, hydrates thereof, oxides thereof, and organic materials. More than one interlayer may be provided.

The interlayer may be formed by, for example, forming the following layers from the carrier side:

a simple metal layer of one element selected from the element group including Cr, Ni, Co, Fe, Mo, Ti, W, P, Cu, Al, and Zn;

an alloy layer of one or more elements selected from the element group including Cr, Ni, Co, Fe, Mo, Ti, W, P, Cu, Al, and Zn; or an organic material layer, and one of the following layers formed thereon: a hydrate or oxide layer of one or more elements selected from the element group including Cr, Ni, Co, Fe, Mo, Ti, W, P, Cu, Al, and Zn; a simple metal layer of one element selected from the element group including Cr, Ni, Co, Fe, Mo, Ti, W, P, Cu, Al, and Zn;

an alloy layer of one or more elements selected from the element group including Cr, Ni, Co, Fe, Mo, Ti, W, P, Cu, Al, and Zn; and an organic material layer.

When the interlayer is provided only on one surface of the carrier, it is preferable to provide an antirust layer, such as a Ni plated layer, on the other surface of the carrier. When the interlayer is provided by a chromate treatment, a zinc chromate treatment, or plating, it is believed that some of the adhering metals, including chromium and zinc, would form hydrates or oxides.

The interlayer also may be formed by, for example, laminating nickel, a nickel-phosphorus alloy or a nickel-cobalt alloy, and chromium, in this order, on the carrier. Because the adhesion between nickel and copper is stronger than the adhesion between chromium and copper, the ultrathin copper layer can detach itself at the interface with the chromium when being detached. The nickel in the interlayer is also expected to provide a barrier effect that prevents the diffusion of the copper component from the carrier into the ultrathin copper layer. The deposit amount of the nickel in the interlayer is preferably 100 $\mu g/dm^2$ to 40,000 $\mu g/dm^2$, more preferably 100 $\mu g/dm^2$ to 4,000 $\mu g/dm^2$, more preferably 100 $\mu g/dm^2$ to 2,500 $\mu g/dm^2$, more preferably 100 $\mu g/dm^2$ or more and less than 1,000 $\mu g/dm^2$. The deposit amount of the chromium in the interlayer is preferably 5 $\mu g/dm^2$ to 100 $\mu g/dm^2$. When the interlayer is provided only on one surface of the carrier, it is preferable to provide an antirust layer, such as a Ni plated layer, on the other surface.

The organic material contained in the interlayer is preferably at least one organic material selected from the group consisting of nitrogen-containing organic compounds, sulfur-containing organic compounds, and carboxylic acids. Specifically, preferred as the nitrogen-containing organic compounds are triazole compounds having a substituent, including, for example, 1,2,3-benzotriazole, carboxybenzotriazole, N',N'-bis(benzotriazolylmethyl)urea, 1H-1,2,4-triazole, and 3-amino-1H-1,2,4-triazole.

Preferred as the sulfur-containing organic compounds are mercaptobenzothiazole, sodium 2-mercaptobenzothiazole, thiocyanuric acid, and 2-benzimidazolethiol.

Preferred as the carboxylic acids are monocarboxylic acids, particularly oleic acid, linoleic acid, and linolenic acid.

Ultrathin Copper Layer

The ultrathin copper layer is provided on the interlayer. Other layers may be provided between the interlayer and the ultrathin copper layer. The ultrathin copper layer may be formed by electroplating of materials such as copper sulfate, copper pyrophosphate, copper sulfamate, and copper cyanide, using an electrolytic bath. Use of a copper sulfate bath is preferred because it is commonly used for electrolytic copper foils, and enables forming a copper foil at high current density. Preferably, an additive having the effect to improve the surface smoothness of the ultrathin copper layer or to improve glossiness, and/or a gloss agent is added to the electrolytic bath used to form the ultrathin copper layer. Known additives may be used as such additives having the effect to improve the surface smoothness of the ultrathin copper layer or to improve glossiness. The gloss agent also may be a known gloss agent. The thickness of the ultrathin copper layer is not particularly limited, and is typically thinner than the carrier, for example, 12 $\mu m$ or less. Typically, the thickness of the ultrathin copper layer is typically 0.01 to 12 $\mu m$, more typically 0.1 to 10 $\mu m$, further typically 0.2 to 9 $\mu m$, more typically 0.3 to 8 $\mu m$, further typically 0.5 to 7 $\mu m$, more typically 1 to 5 $\mu m$, further typically 1.5 to 5 $\mu m$, even more typically 2 to 5 $\mu m$. The ultrathin copper layer may be provided on the both surfaces of the carrier.

The carrier-attached copper foil of the present invention may be used to fabricate a laminate (e.g., a copper-clad laminated board). Such a laminate may have an ordered configuration of, for example, "ultrathin copper layer/interlayer/carrier/resin or prepreg", "carrier/interlayer/ultrathin copper layer/resin or prepreg", "ultrathin copper layer/interlayer/carrier/resin or prepreg/carrier/interlayer/ultrathin copper layer", or "carrier/interlayer/ultrathin copper layer/resin or prepreg/ultrathin copper layer/interlayer/carrier". The resin or prepreg may be a resin layer (described later), and may contain materials such as resins, resin curing agents, compounds, curing promoting agents, dielectrics, reaction catalysts, crosslinking agents, polymers, prepregs, and skeleton materials used for the resin layer described below. The carrier-attached copper foil may be smaller than the resin or prepreg as viewed in a planar view.

Roughening Treatment, and Other Surface Treatments

The surface of the ultrathin copper layer, and/or the surface of the carrier may be subjected to a roughening treatment to provide a roughening treatment layer, for example, for purposes such as providing desirable adhesion for the insulating substrate. The roughening treatment may be performed by, for example, forming roughening particles with copper or a copper alloy. The roughening treatment may be a fine roughening treatment. The roughening treatment layer may be a layer of a simple substance selected from the group consisting of copper, nickel, phosphorous, tungsten, arsenic, molybdenum, chromium, iron, vanadium, cobalt, and zinc, or a layer of an alloy containing one or more of these simple substances. After the formation of roughening particles with copper or a copper alloy, a further roughening treatment may be performed to provide secondary or tertiary particles with a simple substance, specifically, nickel, cobalt, copper, or zinc, or with an alloy thereof. This may be followed by formation of a heat-resistant layer or an antirust layer with a simple substance, specifically, nickel, cobalt, copper, or zinc, or with an alloy thereof, and the surface may be further treated with processes such as a chromate treatment, and a silane coupling process. Alternatively, without a roughening treatment, a heat-resistant layer or an antirust layer of a simple substance, specifically, nickel, cobalt, copper, or zinc, or an alloy thereof, may be formed, and the surface may be further treated with processes such as a chromate treatment, and a silane coupling process. Specifically, one or more layers selected from the group consisting of a heat-resistant layer, an antirust layer, a chromate treated layer, and a silane coupling process layer may be formed on the surface of the roughening treatment layer, and one or more layers selected from the group consisting of a heat-resistant layer, an antirust layer, a chromate treated layer, and a silane coupling process layer may be formed on the surface of the ultrathin copper layer, or on the carrier surface. The heat-resistant layer, the antirust layer, the chromate treated layer, and the silane coupling process layer may each be provided as a plurality of layers (for example, 2 or more layers, 3 or more layers).

The roughening treatment of the present invention may be performed under any of the following conditions a to g.

Roughening Condition A
Solution Composition
    Cu: 10 to 20 g/L
    Co: 1 to 10 g/L
    Ni: 1 to 10 g/L
    pH: 1 to 4
Liquid temperature: 50 to 60° C.
Current density Dk: 30 to 40 A/dm$^2$
Time: 0.2 to 1 s The gravimetrically measured thickness of the roughening treatment layer is adjusted within a 0.05 μm±0.02 μm range.

The gravimetrically measured thickness of the roughening treatment layer is calculated as follows.

Gravimetrically measured thickness of roughening treatment layer (μm)=((sample weight after roughening treatment (g))−(sample weight before roughening treatment (g)))/(copper density 8.94 (g/cm$^3$)×(flat surface area of sample with roughening treatment layer) (cm$^2$))×10,000 (μm/cm)

Roughening Condition b
Solution Composition
    Cu: 10 to 20 g/L
    Co: 1 to 10 g/L
    Ni: 1 to 10 g/L
    pH: 1 to 4
Liquid temperature: 50 to 60° C.
Current density Dk: 20 to 30 A/dm$^2$
Time: 1 to 3 s The gravimetrically measured thickness of the roughening treatment layer is adjusted within a 0.15 μm±0.04 μm range.

Roughening Condition c
Solution Composition
    Cu: 10 to 20 g/L
    Co: 1 to 10 g/L
    Ni: 1 to 10 g/L
    pH: 1 to 4
Liquid temperature: 40 to 50° C.
Current density Dk: 20 to 30 A/dm$^2$
Time: 5 to 8 s The gravimetrically measured thickness of the roughening treatment layer is adjusted within a 0.25 μm±0.05 μm range.

Roughening Condition d
Roughening treatment 1 and roughening treatment 2 are performed in series, in this order.
(1) Roughening Treatment 1
    Solution composition: Cu: 10 to 20 g/L, H$_2$SO$_4$: 50 to 100 g/L
    Liquid temperature: 25 to 50° C.
    Current density: 0.5 to 54 A/dm$^2$
    Coulomb quantity: 2 to 67 As/dm$^2$
(2) Roughening Treatment 2
    Solution composition: Cu: 10 to 20 g/L, Ni: 5 to 15 g/L, Co: 5 to 15 g/L
    pH: 2 to 3
    Liquid temperature: 30 to 50° C.
    Current density: 20 to 46 A/dm$^2$
    Coulomb quantity: 31 to 45 As/dm$^2$ The gravimetrically measured total thickness of the roughening treatment layer after roughening treatment 1 and roughening treatment 2 is adjusted within a 0.35 μm±0.05 μm range.

Roughening Condition e
Roughening treatment 1 and roughening treatment 2 are performed in series, in this order.
(1) Roughening Treatment 1
Solution Composition 1
    Cu: 15 to 35 g/L
    H$_2$SO$_4$: 10 to 150 g/L
    W: 10 to 50 mg/L
    Sodium dodecyl sulfate: 10 to 50 mg/L
    As: 50 to 200 mg/L
Electroplating Condition 1
    Temperature: 30 to 70° C.
    Current density: 30 to 115 A/dm$^2$
    Roughening coulomb quantity: 20 to 450 As/dm$^2$
    Plating time: 0.5 to 15 s
(2) Roughening Treatment 2
Solution Composition 2
    Cu: 20 to 80 g/L
    H$_2$SO$_4$: 50 to 200 g/L
Electroplating Condition 2
    Temperature: 30 to 70° C.
    Current density: 3 to 48 A/dm$^2$
    Roughening coulomb quantity: 20 to 250 As/dm$^2$
    Plating time: 1 to 50 s The gravimetrically measured total thickness of the roughening treatment layer after roughening treatment 1 and roughening treatment 2 is adjusted within a 0.40 μm±0.05 μm range.

Roughening Condition f
Roughening treatment 1 and roughening treatment 2 are performed in series, in this order.
(1) Roughening Treatment 1
Solution Composition 1
    Cu: 15 to 35 g/L
    H$_2$SO$_4$: 10 to 150 g/L
    W: 1 to 50 mg/L
    Sodium dodecyl sulfate: 1 to 50 mg/L
    As: 1 to 200 mg/L
Electroplating Condition 1
    Temperature: 30 to 70° C.
    Current density: 20 to 105 A/dm$^2$
    Roughening coulomb quantity: 50 to 500 As/dm$^2$
    Plating time: 0.5 to 20 s
(2) Roughening Treatment 2
Solution Composition 2
    Cu: 20 to 80 g/L
    H$_2$SO$_4$: 50 to 200 g/L
Electroplating Condition 2
    Temperature: 30 to 70° C.
    Current density: 3 to 48 A/dm$^2$
    Roughening coulomb quantity: 50 to 300 As/dm$^2$
    Plating time: 1 to 60 s The gravimetrically measured total thickness of the roughening treatment layer after roughening treatment 1 and roughening treatment 2 is adjusted within a 0.50 μm±0.05 μm range.

Roughening Condition g
Roughening treatment 1 and roughening treatment 2 are performed in series, in this order.
(1) Roughening Treatment 1
Solution Composition 1
    Cu: 10 to 40 g/L
    H$_2$SO$_4$: 10 to 150 g/L Electroplating Condition 1
  Temperature: 30 to 70° C.
  Current density: 24 to 112 A/dm$^2$
  Roughening coulomb quantity: 70 to 600 As/dm$^2$
  Plating time: 5 to 30 s
(2) Roughening Treatment 2
Solution Composition 2
  Cu: 30 to 90 g/L
  $H_2SO_4$: 50 to 200 g/L
Electroplating Condition 2
  Temperature: 30 to 70° C.
  Current density: 4 to 49 A/dm$^2$
  Roughening coulomb quantity: 70 to 400 As/dm$^2$
  Plating time: 5 to 65 s The gravimetrically measured total thickness of the roughening treatment layer after roughening treatment 1 and roughening treatment 2 is adjusted within a 0.60 μm±0.05 μm range.

The heat-resistant layer, and the antirust layer may be a known heat-resistant layer or a known antirust layer. For example, the heat-resistant layer and/or the antirust layer may be a layer containing one or more elements selected from the group consisting of nickel, zinc, tin, cobalt, molybdenum, copper, tungsten, phosphorus, arsenic, chromium, vanadium, titanium, aluminum, gold, silver, platinum series elements, iron, and tantalum, or may be a metal layer or an alloy layer of these elements. The heat-resistant layer, and/or the antirust layer may contain oxides, nitrides, or silicides containing the foregoing elements. The heat-resistant layer, and/or antirust layer may be a layer containing a nickel-zinc alloy. The heat-resistant layer, and/or antirust layer may be a nickel-zinc alloy layer. The nickel-zinc alloy layer may contain 50 wt % to 99 wt % of nickel, and 50 wt % to 1 wt % of zinc, excluding unavoidable impurities. The total deposit amount of zinc and nickel in the nickel-zinc alloy layer may be 5 to 1,000 mg/m$^2$, preferably 10 to 500 mg/m$^2$, preferably 20 to 100 mg/m$^2$. The deposit amount ratio of nickel and zinc in the nickel-zinc alloy-containing layer or in the nickel-zinc alloy layer (=nickel deposit amount/zinc deposit amount) is preferably 1.5 to 10. The deposit amount of nickel in the nickel-zinc alloy-containing layer or in the nickel-zinc alloy layer is preferably 0.5 mg/m$^2$ to 500 mg/m$^2$, more preferably 1 mg/m$^2$ to 50 mg/m$^2$. The adhesion between the copper foil and the resin substrate improves when the heat-resistant layer and/or the antirust layer is a layer containing a nickel-zinc alloy.

For example, the heat-resistant layer and/or the antirust layer may be an ordered laminate of a nickel or a nickel alloy layer having an deposit amount of 1 mg/m$^2$ to 100 mg/m$^2$, preferably 5 mg/m$^2$ to 50 mg/m$^2$, and a tin layer having a deposit amount of 1 mg/m$^2$ to 80 mg/m$^2$, preferably 5 mg/m$^2$ to 40 mg/m$^2$, and the nickel alloy layer may be configured from any of a nickel-molybdenum alloy, a nickel-zinc alloy, a nickel-molybdenum-cobalt alloy, and a nickel-tin alloy. The heat-resistant layer and/or the antirust layer preferably has a [nickel deposit amount in nickel or nickel alloy]/[tin deposit amount] ratio of 0.25 to 10, more preferably 0.33 to 3. With such a heat-resistant layer and/or an antirust layer, the peel strength of the circuit, and the degradation rate of peel strength against chemicals become desirable after the carrier-attached copper foil is processed into a printed wiring board.

The chromate treated layer is a layer formed after a treatment with a solution containing a chromic anhydride, chromic acid, dichromic acid, chromate, or dichromate. The chromate treated layer may contain elements such as cobalt, iron, nickel, molybdenum, zinc, tantalum, copper, aluminum, phosphorus, tungsten, tin, arsenic, and titanium (may be contained in any form, including metals, alloys, oxides, nitrides, and sulfides). Specific examples of the chromate treated layer include a chromate treated layer treated with an aqueous solution of chromic anhydride or potassium dichromate, and a chromate treated layer treated with a process solution containing chromic anhydride or potassium dichromate, and zinc.

The silane coupling process layer may be formed by using a known silane coupling agent, or by using a silane coupling agent such as epoxy-based silane, amino-based silane, methacryloxy-based silane, mercapto-based silane, vinyl-based silane, imidazole-based silane, and triazine-based silane. Such silane coupling agents may be used as a mixture of two or more. Preferably, the silane coupling process layer is a layer formed by using an amino-based silane coupling agent, or an epoxy-based silane coupling agent.

Preferably, the silane coupling process layer is provided in 0.05 mg/m$^2$ to 200 mg/m$^2$, preferably 0.15 mg/m$^2$ to 20 mg/m$^2$, preferably 0.3 mg/m$^2$ to 2.0 mg/m$^2$ in terms of a silicon atom. The adhesion between the base and the surface-treated copper foil can further improve when the silane coupling process layer is provided in these ranges.

The surface of the ultrathin copper layer, the roughening treatment layer, the heat-resistant layer, the antirust layer, the silane coupling process layer, or the chromate treated layer may be subjected to the surface treatments described in WO2008/053878, JP-A-2008-111169, Japanese Patent No. 5024930, WO2006/028207, Japanese Patent No. 4828427, WO2006/134868, Japanese Patent No. 5046927, WO2007/105635, Japanese Patent No. 5180815, and JP-A-2013-19056.

The carrier-attached copper foil including the carrier, the interlayer laminated on the carrier, and the ultrathin copper layer laminated on the interlayer may include a roughening treatment layer on the ultrathin copper layer, and one or more layers selected from the group consisting of a heat-resistant layer, an antirust layer, a chromate treated layer, and a silane coupling process layer may be provided on the roughening treatment layer.

A roughening treatment layer may be provided on the ultrathin copper layer. A heat-resistant layer and an antirust layer may be provided on the roughening treatment layer. A chromate treated layer may be provided on the heat-resistant layer and the antirust layer. A silane coupling process layer may be provided on the chromate treated layer.

The carrier-attached copper foil may include a resin layer on the ultrathin copper layer, on the roughening treatment layer, on the heat-resistant layer and the antirust layer, on the chromate treated layer, or on the silane coupling process layer. The resin layer may be an insulating resin layer.

The resin layer may be an adhesive, or a partially cured (B stage) insulating resin layer for bonding. Here, "partially cured state (B stage)" refers to a state in which the surface does not feel tacky when touched with a finger, and allows the insulating resin layers to be stored as a laminate, and in which a cure reaction occurs upon a further heat treatment.

The resin layer may contain a thermosetting resin, or may be a thermoplastic resin. The resin layer may contain a thermoplastic resin. The resin is not particularly limited. Preferred examples of the resin include resins containing one or more selected from the group consisting of epoxy resins, polyimide resins, polyfunctional cyanate ester compounds, maleimide compounds, polyvinyl acetal resins, urethane resins, polyethersulfone, polyethersulfone resins, aromatic polyamide resins, polyamideimide resins, rubber-modified epoxy resins, phenoxy resins, carboxyl group-modified acrylonitrile-butadiene resins, polyphenylene oxide, bismaleimidetriazine resins, thermosetting polyphenylene oxide resins, cyanate ester-based resins, anhydrides of polyvalent carboxylic acids, linear polymers having a crosslinkable functional group, polyphenylene ether resins, 2,2-bis(4-cyanatephenyl)propane, phosphorus-containing phenol compounds, manganese naphthenate, 2,2-bis(4-glycidylphenyl)propane, polyphenylene ether-cyanate-based resins, siloxane-modifiedpolyamideimide resins, cyano ester resins, phosphazene-based resins, rubber-modified polyamideimide resins, isoprene, hydrogenated polybutadiene, polyvinyl butyral, phenoxys, high-molecular epoxys, aromatic polyamides, fluororesin, bisphenols, block copolymerized polyimide resins, and cyano ester resins.

Use of the epoxy resin does not pose any problem, provided that it contains two or more epoxy groups within the molecule, and can be used in electrical and electronic material applications. The epoxy resin is preferably an epoxy resin that has been epoxylated with a compound having two or more glycidyl groups within the molecule. The epoxy resin may be one or a mixture of two or more selected from the group consisting of bisphenol A-type epoxy resins, bisphenol F-type epoxy resins, bisphenol S-type epoxy resins, bisphenol AD-type epoxy resins, novolac-type epoxy resins, cresol novolac-type epoxy resins, alicyclic epoxy resins, brominated epoxy resins, phenol novolac-type epoxy resins, naphthalene-type epoxy resins, brominated bisphenol A-type epoxy resins, ortho-cresol novolac-type epoxy resins, rubber-modified bisphenol A-type epoxy resins, glycidylamine-type epoxy resins, glycidylamine compounds (such as triglycidyl isocyanurate, and N,N-diglycidyl aniline), glycidyl ester compounds (such as a tetrahydrophthalic acid diglycidyl ester), phosphorus-containing epoxy resins, biphenyl-type epoxy resins, biphenyl novolac-type epoxy resins, tris-hydroxyphenyl methane-type epoxy resins, and tetraphenylethane-type epoxy resins. The epoxy resin also may be a hydrogenated or halogenated form of these epoxy resins.

The phosphorus-containing epoxy resins may be known epoxy resins containing phosphorus. Preferably, the phosphorus-containing epoxy resins are, for example, epoxy resins obtained as derivatives of 9,10-dihydro-9-oxa-10-phosphaphenanthrene-10-oxide having two or more epoxy groups within the molecule.

The resin layer may contain known materials, including resins, resin curing agents, compounds, curing promoting agents, dielectrics (may be any dielectrics, including dielectrics containing an inorganic compound and/or an organic compound, and dielectrics containing a metal oxide), reaction catalysts, crosslinking agents, polymers, prepregs, skeleton materials, and the resins and the compounds exemplified above. The resin layer may be formed by using the substances (including resins, resin curing agents, compounds, curing promoting agents, dielectrics, reaction catalysts, crosslinking agents, polymers, prepregs, and skeleton materials), and/or the resin layer forming methods and apparatuses described in, for example, WO2008/004399, WO2008/053878, WO2009/084533, JP-A-11-5828, JP-A-11-140281, Japanese Patent No. 3184485, WO97/02728, Japanese Patent No. 3676375, JP-A-2000-43188, Japanese Patent No. 3612594, JP-A-2002-179772, JP-A-2002-359444, JP-A-2003-304068, Japanese Patent No. 3992225, JP-A-2003-249739, Japanese Patent No. 4136509, JP-A-2004-82687, Japanese Patent No. 4025177, JP-A-2004-349654, Japanese Patent No. 4286060, JP-A-2005-262506, Japanese Patent No. 4570070, JP-A-2005-53218, Japanese Patent No. 3949676, Japanese Patent No. 4178415, WO2004/005588, JP-A-2006-257153, JP-A-2007-326923, JP-A-2008-111169, Japanese Patent No. 5024930, WO2006/028207, Japanese Patent No. 4828427, JP-A-2009-67029, WO2006/134868, Japanese Patent No. 5046927, JP-A-2009-173017, WO2007/105635, Japanese Patent No. 5180815, WO2008/114858, WO2009/008471, JP-A-2011-14727, WO2009/001850, WO2009/145179, WO2011/068157, and JP-A-2013-19056.

Resin Layer Containing Dielectric (Dielectric Filler)

The resin layer may contain a dielectric (a dielectric filler).

When a dielectric (a dielectric filler) is incorporated in any of the resin layers above or in the resin composition, it is possible to form a capacitor layer, and increase the capacitance of a capacitor circuit. A dielectric powder of composite oxides having a perovskite structure, such as $BaTiO_3$, $SrTiO_3$, $Pb(Zr—Ti)O_3$ (common name: PZT), $PbLaTiO_3 \cdot PbLaZrO$ (common name: PLZT), $SrBi_2Ta_2O_9$ (common name: SBT) is used as the dielectric (dielectric filler).

The resin, and/or the resin composition, and/or the compound contained in the resin layer are dissolved in a solvent, for example, such as methyl ethyl ketone (MEK), and toluene to prepare a resin solution. The resin solution is applied to the ultrathin copper layer, or to the heat-resistant layer or the antirust layer, the chromate coating layer, or the silane coupling agent layer by using a technique, for example, such as roll coating, and, as required, heated to dry and remove the solvent and produce the B-stage state. The solution may be dried using, for example, a hot-air drying furnace. The drying temperature may be 100 to 250° C., preferably 130 to 200° C.

In an aspect of the invention, the carrier-attached copper foil with the resin layer (resin- and carrier-attached copper foil) is used after the following procedure. The carrier-attached copper foil with the resin layer is mated with a base on the resin layer side, and the whole is thermocompressed to heat cure the resin layer. The carrier is then detached to expose the ultrathin copper layer (evidently, the surface exposed is the interlayer side of the ultrathin copper layer). A predetermined wiring pattern is then formed on the exposed surface.

With the resin- and carrier-attached copper foil, the number of prepregs used for the production of a laminated printed circuit board can be reduced. The resin- and carrier-attached copper foil also enables producing a copper-clad laminated board without providing the resin layer in a thickness that ensures insulation between layers, or without using a prepreg material at all. The surface smoothness can be further improved by undercoating an insulating resin on the base surface.

The lack of need to use a prepreg material is also advantageous from the economical standpoint because it can save the material cost of prepreg material, and simplifies the lamination process. Another advantage is that the laminated printed circuit board can be made thinner by the amount that would otherwise be occupied by the prepreg material thickness, making it possible to produce an ultrathin laminated printed circuit board with a single-layer thickness of 100 μm or less.

The thickness of the resin layer is preferably 0.1 to 80 μm. When the resin layer thickness is below 0.1 μm, the adhesion suffers, and it may become difficult to ensure interlayer insulation from the circuit of an inner layer material when a prepreg material is not interposed in laminating the resin- and carrier-attached copper foil to a base provided with an inner layer material.

On the other hand, it is economically disadvantageous to make the resin layer thicker than 80 μm because it makes it difficult to form a resin layer of the intended thickness in a single coating step, and increases the material cost and the man-hour. Further, because such a resin layer involves poor flexibility, cracking tends to occur during handling, and smooth lamination may be impeded by the excess resin flow generated during the thermocompression with the inner layer material.

As another product form of the resin- and carrier-attached copper foil, the resin layer may be coated over the ultrathin copper layer, or over the heat-resistant layer or the antirust layer, the chromate treated layer, or the silane coupling process layer. After creating a partially cured state, the carrier may be detached to produce a resin-attached copper foil that lacks the carrier.

A printed circuit board is completed upon mounting electronic components on the printed wiring board. As used herein, "printed wiring board" is inclusive of a printed wiring board, printed circuit board, and printed board populated with electronic components, as above.

The printed wiring board may be used to fabricate an electronic device. The printed circuit board populated with electronic components may be used to fabricate an electronic device. The printed board populated with electronic components may be used to fabricate an electronic device. Examples of the printed wiring board manufacturing process using the carrier-attached copper foil according to the present invention are given below.

An embodiment of the printed wiring board producing method according to the present invention includes:
preparing a carrier-attached copper foil according to the present invention, and an insulating substrate;
laminating the carrier-attached copper foil and the insulating substrate to each other;
forming a copper-clad laminated board by detaching the carrier of the carrier-attached copper foil after the carrier-attached copper foil and the insulating substrate are laminated to each other with the ultrathin copper layer side facing the insulating substrate; and
forming a circuit by using any of a semi-additive process, a modified semi-additive process, a partly additive process, and a subtractive process.

The insulating substrate may be a substrate with an inner layer circuit.

As used herein, "semi-additive process" refers to a method in which thin non-electrolytic plating is performed on the insulating substrate or on a copper foil seed layer, and a conductor pattern is formed by performing electroplating and etching after the pattern formation.

Accordingly, an embodiment of the printed wiring board producing method according to the present invention using the semi-additive process includes:
preparing a carrier-attached copper foil according to the present invention, and an insulating substrate;
laminating the carrier-attached copper foil and the insulating substrate to each other;
detaching the carrier of the carrier-attached copper foil after the carrier-attached copper foil and the insulating substrate are laminated to each other;
completely removing the ultrathin copper layer exposed upon detaching the carrier, using a method such as etching with an acid or other such corrosive solution, or using a plasma;
providing a through hole and/or a blind via through the resin exposed after the ultrathin copper layer is removed by etching;
performing a desmear process for a region containing the through hole and/or the blind via;
providing a non-electrolytic plating layer for the resin and the region containing the through hole and/or the blind via;
providing a plating resist on the non-electrolytic plating layer;
exposing the plating resist, and removing the plating resist in a region where a circuit is to be formed;
providing an electrolytic plating layer in the region from which the plating resist has been removed and where a circuit is to be formed;
removing the plating resist; and
removing the non-electrolytic plating layer by using a technique such as flash etching in a region other than the region where a circuit is to be formed.

Another embodiment of the printed wiring board producing method according to the present invention using the semi-additive process includes:
preparing a carrier-attached copper foil according to the present invention, and an insulating substrate;
laminating the carrier-attached copper foil and the insulating substrate to each other;
detaching the carrier of the carrier-attached copper foil after the carrier-attached copper foil and the insulating substrate are laminated to each other;
providing a through hole and/or a blind via through the ultrathin copper layer exposed upon detaching the carrier, and through the insulating resin substrate;
performing a desmear process for a region containing the through hole and/or the blind via;
completely removing the ultrathin copper layer exposed upon detaching the carrier, using a method such as etching with an acid or other such corrosive solution, or using a plasma;
providing a non-electrolytic plating layer for the resin and the region containing the through hole and/or the blind via exposed after the ultrathin copper layer is removed by a method such as etching;
providing a plating resist on the non-electrolytic plating layer;
exposing the plating resist, and removing the plating resist in a region where a circuit is to be formed;
providing an electrolytic plating layer in the region from which the plating resist has been removed and where a circuit is to be formed;
removing the plating resist; and
removing the non-electrolytic plating layer by using a technique such as flash etching in a region other than the region where a circuit is to be formed.

Another embodiment of the printed wiring board producing method according to the present invention using the semi-additive process includes:
preparing a carrier-attached copper foil according to the present invention, and an insulating substrate;
laminating the carrier-attached copper foil and the insulating substrate to each other;
detaching the carrier of the carrier-attached copper foil after the carrier-attached copper foil and the insulating substrate are laminated to each other;
providing a through hole and/or a blind via through the ultrathin copper layer exposed upon detaching the carrier, and through the insulating resin substrate;
completely removing the ultrathin copper layer exposed upon detaching the carrier, using a method such as etching with an acid or other such corrosive solution, or using a plasma;

performing a desmear process for a region containing the through hole and/or the blind via;

providing a non-electrolytic plating layer for the resin and the region containing the through hole and/or the blind via exposed after the ultrathin copper layer is removed by a method such as etching;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer by using a technique such as flash etching in a region other than the region where a circuit is to be formed.

Another embodiment of the printed wiring board producing method according to the present invention using the semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

completely removing the ultrathin copper layer exposed upon detaching the carrier, using a method such as etching with an acid or other such corrosive solution, or using a plasma;

providing a non-electrolytic plating layer for a surface of the resin exposed after the ultrathin copper layer is removed by etching;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer and the ultrathin copper layer by using a technique such as flash etching in a region other than the region where a circuit is to be formed.

As used herein, "modified semi-additive process" refers to a method in which a metal foil is laminated on an insulating layer, and the copper in a circuit forming portion is thickened by electrolytic plating while protecting a non-circuit forming portion with a plating resist. After removing the resist, the metal foil is removed by (flash) etching except in the circuit forming portion to form a circuit on the insulating layer.

Accordingly, an embodiment of the printed wiring board producing method according to the present invention using the modified semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

performing a desmear process for a region containing the through hole and/or the blind via;

providing a non-electrolytic plating layer for the region containing the through hole and/or the blind via;

providing a plating resist on the surface of the ultrathin copper layer exposed upon detaching the carrier;

forming a circuit by electrolytic plating after the plating resist is provided;

removing the plating resist; and removing the ultrathin copper layer by flash etching after the ultrathin copper layer is exposed upon removal of the plating resist.

Another embodiment of the printed wiring board producing method according to the present invention using the modified semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a plating resist on the ultrathin copper layer exposed upon detaching the carrier;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer and the ultrathin copper layer by using a technique such as flash etching in a region other than the region where a circuit is to be formed.

As used herein, "partly additive process" refers to a method in which a catalyst colloid is applied to a substrate provided with a conductor layer, or to a substrate that has been drilled to forma through hole or a via hole as required. After forming a conductor circuit by etching, a solder resist or a plating resist is provided as needed, and a plating is applied to the conductor circuit, and to the through hole or via hole by performing a non-electrolytic plating process to produce a printed wiring board.

Accordingly, an embodiment of the printed wiring board producing method according to the present invention using the partly additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

performing a desmear process for a region containing the through hole and/or the blind via;

applying a catalyst colloid to the region containing the through hole and/or the blind via;

providing an etching resist on the surface of the ultrathin copper layer exposed upon detaching the carrier;

exposing the etching resist, and forming a circuit pattern;

removing the ultrathin copper layer and the catalyst colloid using a method such as etching with an acid or other such corrosive solution, or using a plasma to form a circuit;

removing the etching resist;

providing a solder resist or a plating resist on the surface of the insulating substrate exposed after the ultrathin copper layer and the catalyst colloid are removed using a method such as etching with an acid or other such corrosive solution, or using a plasma; and providing a non-electrolytic plating layer in a region where the solder resist or the plating resist is not provided.

As used herein, "subtractive process" refers to a method in which unwanted portions of the copper foil on the copper-clad laminated board are selectively removed by etching or the like to form a conductor pattern.

Accordingly, an embodiment of the printed wiring board producing method according to the present invention using the subtractive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

performing a desmear process for a region containing the through hole and/or the blind via;

providing a non-electrolytic plating layer for the region containing the through hole and/or the blind via;

providing an electrolytic plating layer on the surface of the non-electrolytic plating layer;

providing an etching resist on surfaces of the electrolytic plating layer and/or the ultrathin copper layer;

exposing the etching resist, and forming a circuit pattern;

removing the ultrathin copper layer, the non-electrolytic plating layer, and the electrolytic plating layer using a method such as etching with an acid or other such corrosive solution, or using a plasma to form a circuit; and removing the etching resist.

Another embodiment of the printed wiring board producing method according to the present invention using the subtractive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

performing a desmear process for a region containing the through hole and/or the blind via;

providing a non-electrolytic plating layer for the region containing the through hole and/or the blind via;

forming a mask on a surface of the non-electrolytic plating layer;

providing an electrolytic plating layer on the non-electrolytic plating layer in a surface on which the mask is not formed;

providing an etching resist on surfaces of the electrolytic plating layer and/or the ultrathin copper layer;

exposing the etching resist, and forming a circuit pattern;

removing the ultrathin copper layer and the non-electrolytic plating layer using a method such as etching with an acid or other such corrosive solution, or using a plasma to form a circuit; and removing the etching resist.

The step of forming a through hole and/or a blind via, and the next desmear step may be omitted.

A specific example of the printed wiring board producing method using the carrier-attached copper foil of the present invention is described below with reference to the accompanying drawings. The following descriptions will be given through the case of a carrier-attached copper foil having an ultrathin copper layer with a roughening treatment layer formed thereon. However, the printed wiring board producing method is not limited to this example, and may be performed in the same manner with a carrier-attached copper foil having a ultrathin copper layer that does not have a roughening treatment layer. First, as illustrated in FIG. 1A, a carrier-attached copper foil with an ultrathin copper layer having formed thereon a roughening treatment layer (first carrier-attached copper foil layer) is prepared.

As illustrated in FIG. 1B, a resist is applied to the roughening treatment layer on the ultrathin copper layer, and the resist is etched into a predetermined shape after exposure and development.

As illustrated in FIG. 1C, the resist is removed after circuit plating formation, and a circuit plating of a predetermined shape is formed.

As illustrated in FIG. 2A, an embedding resin is provided on the ultrathin copper layer so as to cover (embed) the circuit plating, and laminate a resin layer, and another carrier-attached copper foil (second carrier-attached copper foil layer) is bonded from the ultrathin copper layer side.

Figure 2B:
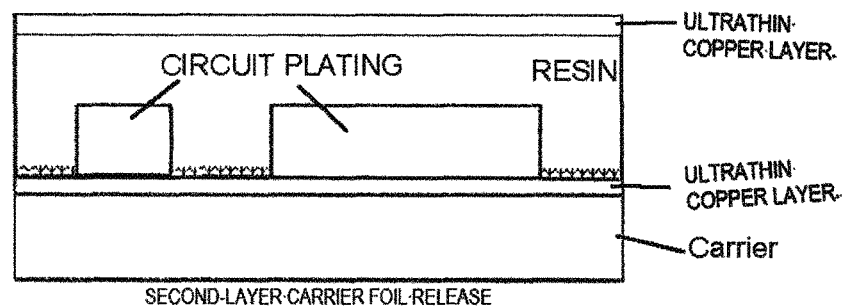

As illustrated in FIG. 2B, the carrier is detached from the second carrier-attached copper foil layer.

Figure 2C:
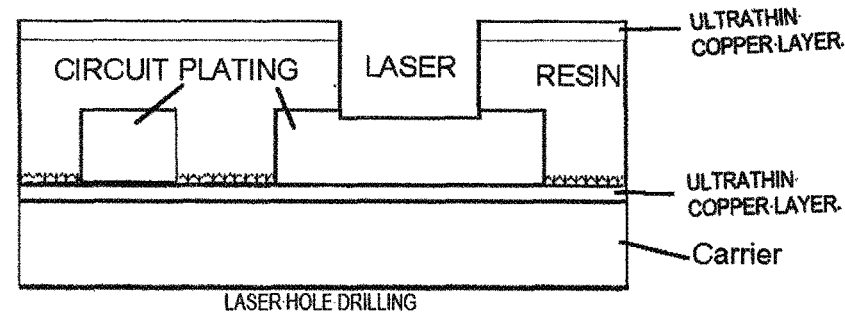

As illustrated in FIG. 2C, the resin layer is laser drilled at a predetermined position to expose the circuit plating and form a blind via.

Figure 3A:
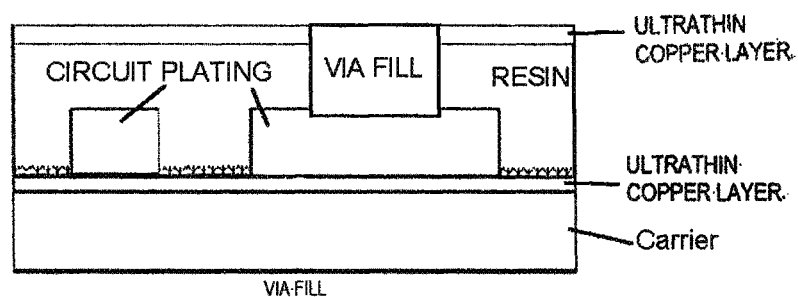
FIGS. 3A, 3B and 3C are schematic views representing a wiring board cross section in processes from formation of a via fill to detachment of a first carrier layer according to a specific example of the printed wiring board producing method using a carrier-attached copper foil of an embodiment of the present invention.

As illustrated in FIG. 3A, copper is embedded in the blind via to form a via fill.

Figure 3B:
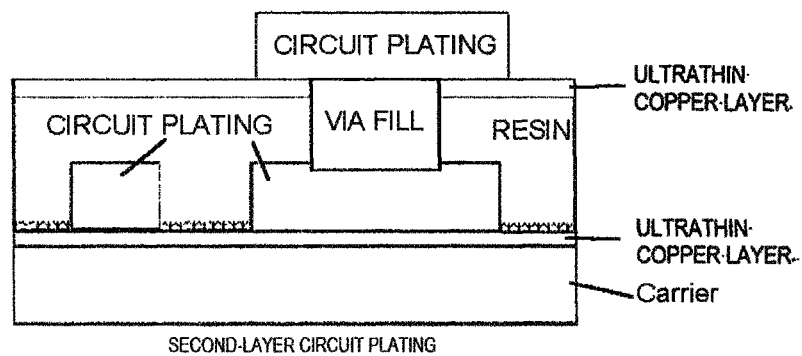

As illustrated in FIG. 3B, a circuit plating is formed on the via fill as in FIG. 1B, and FIG. 1C.

Figure 3C:
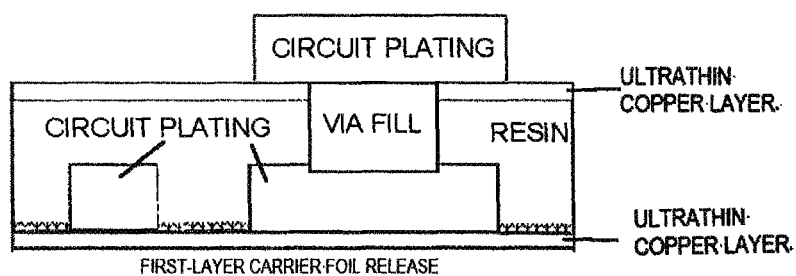

As illustrated in FIG. 3C, the carrier is detached from the first carrier-attached copper foil layer.

As illustrated in FIG. 4A, the ultrathin copper layers are removed from the both surfaces by flash etching to expose the surface of the circuit plating in the resin layer.

As illustrated in FIG. 4B, a bump is formed on the circuit plating in the resin layer, and a copper pillar is formed on the solder. This completes a printed wiring board using the carrier-attached copper foil of the embodiment of the present invention.

In the printed wiring board producing method described above, "ultrathin copper layer" may be read as carrier, and "carrier" may be read as ultrathin copper layer so that a circuit is formed on the carrier side of the carrier-attached copper foil, and embedded in the resin to produce a printed wiring board.

Aside from the carrier-attached copper foil of the embodiment of the present invention, the separate carrier-attached copper foil (second layer) may use a carrier-attached copper foil of related art, or a common copper foil. One or more circuit layers may be formed on the second circuit layer shown in FIG. 3B. Such circuits may be formed by using any of the semi-additive process, the subtractive process, the partly additive process, and the modified semi-additive process.

The printed wiring board producing method described above produces a configuration in which the circuit plating is embedded in the resin layer. The circuit plating is thus protected by the resin layer, and can maintain its shape, for example, when removing the ultrathin copper layer by flash etching as in FIG. 4A. The method thus makes it easier to form a finer circuit. Further, because the circuit plating is protected by the resin layer, anti-migration improves, and the conduction of circuit wires can be desirably reduced. This makes it easier to form a fine circuit. Further, because the exposed surface of the circuit plating becomes depressed into the resin layer upon removal of the ultrathin copper layer by flash etching as in FIG. 4A and FIG. 4B, it becomes easier to form a bump on the circuit plating, and the copper pillar on the bump. This improves the production efficiency.

Known resins, and known prepregs may be used as the embedding resin (resin). For example, a BT (bismaleimide triazine) resin, a prepreg as a BT resin-impregnated glass fabric, or an ABF film or an ABF (manufactured by Ajinomoto Fine-Techno Co., Ltd.) may be used. The embedding resin (resin) may use the resin layer, and/or the resin, and/or the prepreg, and/or the film described in this specification.

The carrier-attached copper foil used as the first layer may have a substrate or a resin layer on a surface of the carrier-attached copper foil. The substrate or resin layer supports the first-layer carrier-attached copper foil, and the carrier-attached copper foil becomes less likely to wrinkle. This is advantageous in terms of productivity. The substrate or the resin layer may be any substrate or resin layer, provided that it has the effect to support the carrier-attached copper foil used as the first layer. For example, the substrate and the resin layer may be any of the carriers, the prepregs, and the resin layers described in this specification as substrates or resin layers, or may be a known carrier, prepreg, resin layer, metal board, metal foil, inorganic compound board, inorganic compound foil, organic compound board, organic compound foil, or resin substrate.

The printed wiring board producing method of the present invention may be a printed wiring board producing method (coreless method) that includes:

laminating a resin substrate to the surface of the carrier-attached copper foil of the present invention on the ultrathin copper layer side or on the carrier side;

providing a dual layer of resin and circuit at least once on the carrier-attached copper foil surface opposite the ultrathin copper layer side or the carrier side laminated to the resin substrate; and detaching the carrier or the ultrathin copper layer from the carrier-attached copper foil after forming the a dual layer of resin and circuit.

The dual layer of resin and circuit may be provided in order from the resin layer to the circuit, or from the circuit to the resin layer.

As a specific example of the coreless method, a resin substrate is laminated to the surface of the carrier-attached copper foil of the present invention on the ultrathin copper layer side or the carrier side to produce a laminate (a copper-clad laminated board, or a copper-clad laminate). A resin layer is then formed on the carrier-attached copper foil surface opposite the ultrathin copper layer side or the carrier side laminated to the resin substrate. The carrier side or the ultrathin copper layer side of another carrier-attached copper foil may be laminated to the resin layer formed on the carrier-side surface or the ultrathin copper layer-side surface. In this case, the printed wiring board producing method (coreless method) may be applied to (i) a laminate of a configuration in which the carrier-attached copper foil is laminated to the both surfaces of a center resin substrate in order of carrier/interlayer/ultrathin copper layer, or ultrathin copper layer/interlayer/carrier, (ii) a laminate of a configuration in which the carrier-attached copper foil is laminated to the both surfaces of a center resin substrate in order of carrier/interlayer/ultrathin copper layer/resin substrate/ultrathin copper layer/interlayer/carrier, (iii) a laminate of a configuration in which the carrier-attached copper foil is laminated to the both surfaces of a center resin substrate in order of carrier/interlayer/ultrathin copper layer/resin substrate/carrier/interlayer/ultrathin copper layer, or (iv) a laminate of a configuration in which the carrier-attached copper foil is laminated to the both surfaces of a center resin substrate in order of ultrathin copper layer/interlayer/carrier/resin substrate/carrier/interlayer/ultrathin copper layer.

The exposed surface of the ultrathin copper layer or the carrier at the both ends may be further provided with another resin layer, and a circuit may be formed by processing a copper layer or a metal layer after providing these layers. Yet another resin layer may be provided on the circuit in such a manner that the circuit is embedded in the resin layer. Such circuit and resin layer formation may be performed one or more times (build-up method). The laminate (hereinafter, also referred to as "laminate B") formed in the manner described above may be used to fabricate a coreless substrate upon detaching the ultrathin copper layer or the carrier of each carrier-attached copper foil from the carrier or the ultrathin copper layer. For the fabrication of the coreless substrate, two carrier-attached copper foils may be used to produce a laminate of an ultrathin copper layer/interlayer/carrier/carrier/interlayer/ultrathin copper layer configuration, a laminate of a carrier/interlayer/ultrathin copper layer/ultrathin copper layer/interlayer/carrier configuration, or a laminate of a carrier/interlayer/ultrathin copper layer/carrier/interlayer/ultrathin copper layer configuration, and the laminate may be used at the center.

A dual layer of resin and circuit may be provided at least once on the ultrathin copper layer surface or the carrier surface on the both sides of such a laminate (hereinafter, also referred to as "laminate A"). After one or more formation of the a dual layer of resin and circuit, the ultrathin copper layer or the carrier of each carrier-attached copper foil may be detached from the carrier or the ultrathin copper layer to fabricate a coreless substrate. The laminate may include other layers on the ultrathin copper layer surface, on the carrier surface, between the carriers, between the ultrathin copper layers, or between the ultrathin copper layer and the carrier. Other layers may be resin layers or resin substrates. As used herein, "ultrathin copper layer surface", "ultrathin copper layer-side surface", "ultrathin copper layer surface", "carrier surface", "carrier-side surface", "carrier surface", "surface of laminate", and "laminate surface" are a concept that encompasses the surface (outermost surface) of other layers when the ultrathin copper layer, the carrier, and the laminate have other layers on the ultrathin copper layer surface, the carrier surface, and the laminate surface. Preferably, the laminate has an ultrathin copper layer/interlayer/carrier/carrier/interlayer/ultrathin copper layer configuration. This is because, when such a laminate is used to fabricate a coreless substrate, the ultrathin copper layer will be disposed on the coreless substrate side, and a circuit can more easily be formed on the coreless substrate using the modified semi-additive process. Another reason is that, because of the thin thickness of the ultrathin copper layer, it becomes easier to remove the ultrathin copper layer, and form a circuit on a coreless substrate in the semi-additive process after the removal of the ultrathin copper layer.

Note that the term "laminate", when used without being specified as "laminate A" or "laminate B", refers to laminates that include at least laminate A and laminate B.

In the method of production of a coreless substrate above, by covering the end surfaces of the carrier-attached copper foil or the laminate (laminate A) either in part or as a whole with resin, seeping of chemicals into the interlayer or between the two carrier-attached copper foils constituting the laminate can be prevented during the production of a printed wiring board by the build-up method. Separation of the ultrathin copper layer and the carrier due to chemical seeping, and corrosion of the carrier-attached copper foil also can be prevented to improve yield. Here, a resin that can be used for the resin layer can be used as the resin that covers a part of or the whole end surfaces of the carrier-attached copper foil, or as the resin that covers a part of or the whole end surfaces of the laminate.

In the method of production of a coreless substrate above, a resin or a prepreg may cover at least a part of the periphery of the laminated portion of the carrier-attached copper foil or the laminate (the laminated portion between the carrier and the ultrathin copper layer, or the laminated portion between two carrier-attached copper foils) in a planar view of the carrier-attached copper foil or the laminate. The laminate (laminate A) formed by the method of production of a coreless substrate above may be configured as a laminate in which a pair of carrier-attached copper foils are separably in contact with each other. A resin or a prepreg may cover the whole periphery of the laminated portion of the carrier-attached copper foil or the laminate (the laminated portion between the carrier and the ultrathin copper layer, or the laminated portion between two carrier-attached copper foils) in a planar view of the carrier-attached copper foil. Preferably, the resin or prepreg is larger than the carrier-attached copper foil, the laminate, or the laminated portion of the laminate in planar view, and it is preferable to make a laminate of a configuration in which the carrier-attached copper foil or the laminate is enveloped (contained) with the resin or prepreg laminated on the both surfaces of the carrier-attached copper foil or the laminate. With such a configuration, the resin or prepreg covering the laminated portion of the carrier-attached copper foil or the laminate can prevent the laminated portion from contacting other members from the side, specifically from a lateral direction with respect to the direction of lamination, in a planar view of the carrier-attached copper foil or the laminate. This makes it possible to reduce the risk of detachment between the carrier and the ultrathin copper layer, or between the carrier-attached copper foils during handling. By covering the periphery of the laminated portion of the carrier-attached copper foil or the laminate with a resin or a prepreg to prevent exposure, entry of chemicals at the interface of the laminated portion can be prevented in the chemical processes described above, and the carrier-attached copper foil can be prevented from being corroded or eroded. When separating one of the carrier-attached copper foils from a pair of carrier-attached copper foils in the laminate, or when separating the carrier and the copper foil (ultrathin copper layer) of the carrier-attached copper foil, it may be necessary to remove the laminated portion or other portions by, for example, cutting the necessary portion in case where the laminated portion of the carrier-attached copper foil or the laminate covered with a resin or a prepreg (the laminated portion between the carrier and the ultrathin copper layer, or the laminated portion between two carrier-attached copper foils) is strongly bonded with the resin or prepreg, or with other materials.

The carrier side or the ultrathin copper layer side of the carrier-attached copper foil of the present invention may be laminated to the carrier side or the ultrathin copper layer side of another carrier-attached copper foil of the present invention to construct a laminate. The laminate may be one in which the carrier-side surface or the ultrathin copper layer-side surface of the carrier-attached copper foil is directly laminated to the carrier-side surface or the ultrathin copper layer-side surface of another carrier-attached copper foil with an adhesive, if need be. The carrier or the ultrathin copper layer of the carrier-attached copper foil may be joined to the carrier or the ultrathin copper layer of another carrier-attached copper foil. As used herein, "join" encompasses joining via a surface treatment layer when the carrier or the ultrathin copper layer has a surface treatment layer. A part of or the whole end surfaces of the laminate may be covered with resin.

Aside from simple lamination, the lamination between the carriers, between the ultrathin copper layers, between the carrier and the ultrathin copper layer, and between the carrier-attached copper foils may be achieved, for example, using the following methods.

(a) Metallurgical joining method: Fusion welding (arc welding, TIG (tungsten inert gas) welding, MIG (metal inert gas) welding, resistance welding, seam welding, spot welding), pressure welding (ultrasonic welding, friction stir welding), and brazing and soldering;

(b) Mechanical joining method: joining by swaging or riveting, (joining by self-piercing riveting, joining by riveting), stitcher;

(c) Physical joining method: adhesive, (double-sided) adhesive tape.

By joining a part or the whole of the carrier to a part or the whole of the other carrier or to a part or the whole of the ultrathin copper layer using the foregoing joining methods, it is possible to produce a laminate of a configuration in which the carrier is laminated to the other carrier or to the ultrathin copper layer, and in which the carriers or the carrier and the ultrathin copper layer are separably in contact with each other. When the carrier is laminated to the other carrier or to the ultrathin copper layer by being weakly joined to the other carrier or to the ultrathin copper layer, the carrier can be separated from the other carrier or from the ultrathin copper layer without removing the portion joining the carrier to the other carrier or to the ultrathin copper layer. When the carrier is strongly joined to the other carrier or to the ultrathin copper layer, the carrier can be separated from the other carrier or from the ultrathin copper layer by removing the joined portion between the carriers by means of, for example, cutting, chemical polishing (such as etching), or mechanical polishing.

A printed wiring board can be fabricated by providing a dual layer of resin and circuit at least once for the laminate configured as above, and detaching the ultrathin copper layer or the carrier from the carrier-attached copper foil of the laminate after the a dual layer of resin and circuit is formed at least once. The dual layer of resin and circuit may be provided on one or both surfaces of the laminate.

The resin substrate, the resin layer, the resin, and the prepreg used for the laminate may be the resin layer described in this specification, and may contain materials such as resins, resin curing agents, compounds, curing promoting agents, dielectrics, reaction catalysts, crosslinking agents, polymers, prepregs, and skeleton materials used for the resin layer described in this specification. The carrier-attached copper foil may be smaller than the resin or prepreg as viewed in a planar view.

EXAMPLES

The present invention is described below in greater detail referring to Examples of the present invention. However, the present invention is in no way limited by the following Examples.
(1) Fabrication of Carrier
The carrier was fabricated as follows.

Carrier Fabrication Method a (Examples 1 to 3, and Comparative Examples 1 and 5)

A 25 μm-thick smooth polyimide film Upilex SGA (a BPDA-PPD-basedpolyimide film; manufactured by Ube Industries Ltd.) was used as the carrier. The smooth polyimide film was subjected to a plasma treatment on the surface to be provided with the ultrathin copper layer, as follows. The smooth polyimide film was set in a vacuum device. After vacuum evacuation, oxygen was introduced into the chamber to bring the chamber pressure to 5 to 12 Pa. A plasma treatment was then performed at 100 to 200 W for 20 to 40 s.

The surface of the smooth polyimide film to be provided with the ultrathin copper layer had a ten-point mean roughness Rz (JIS B0601 1994) of 0.5 to 18 nm before plasma treatment, and 2.5 to 20 nm after plasma treatment.

The ten-point mean roughness Rz of the smooth polyimide film surface to be provided with the ultrathin copper layer was measured before and after the plasma treatment using the device below under the following measurement conditions.

Device: Shimadzu Corporation scanning probe microscope SPM-9600
Conditions: Dynamic mode
Scan range: 1 μm×1 μm
Number of pixels: 512×512

Carrier Fabrication Method B (Examples 4 and 11)

A titanium rotary drum (electrolytic drum) was prepared. The surface of the electrolytic drum was ground under specific electrolytic drum surface control conditions with an abrasive wheel grinding material of a grain size #3000 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.

Electrolytic Solution Composition
Copper: 80 to 110 g/L
Sulfuric acid: 70 to 110 g/L
Chlorine: 10 to 100 mass ppm
Fabrication Conditions
　Current density: 50 to 200 A/dm$^2$
　Electrolytic solution temperature: 40 to 70° C.
　Electrolytic solution linear velocity: 3 to 5 m/sec
　Electrolysis time: 0.5 to 10 min The copper deposited on the surface of the rotating electrolytic drum was scraped off, and used as the carrier. The interlayer was formed on the glossy surface side of the electrolytic copper foil.

Carrier Fabrication Method C (Examples 5 to 7)

An 18 μm-thick electrolytic copper foil was fabricated using the electrolytic solution below. The interlayer was formed on the glossy surface side of the electrolytic copper foil.

Electrolytic Solution Composition
　Copper: 90 to 110 g/L
　Sulfuric acid: 90 to 110 g/L
　Chlorine: 50 to 100 ppm
Leveling agent 1 (bis(3-sulfopropyl)disulfide): 10 to 30 ppm
Leveling agent 2 (amine compound): 10 to 30 ppm The amine compound used had the following chemical formula.

$$\text{CH}_2\text{—CH—CH}_2\text{—O—CH}_2\text{—CH—CH—CH—CH—CH}_2\text{—O—CH}_2\text{—CH—CH}_2 \quad (1)$$

In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.

Fabrication Conditions
　Current density: 70 to 100 A/dm$^2$
　Electrolytic solution temperature: 50 to 60° C.
　Electrolytic solution linear velocity: 3 to 5 m/sec
　Electrolysis time: 0.5 to 10 min Carrier Fabrication Method D (Example 8)

A titanium rotary drum (electrolytic drum) was prepared. The surface of the electrolytic drum was ground under specific electrolytic drum surface control conditions with an abrasive wheel grinding material of a grain size #1000 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.

Electrolytic Solution Composition

Copper: 80 to 110 g/L
Sulfuric acid: 70 to 110 g/L
Chlorine: 10 to 100 mass ppm
Fabrication Conditions
Current density: 50 to 200 A/dm$^2$
Electrolytic solution temperature: 40 to 70° C.
Electrolytic solution linear velocity: 3 to 5 m/sec
Electrolysis time: 0.5 to 10 min The copper deposited on the surface of the rotating electrolytic drum was scraped off, and the glossy surface side was plated with a plating solution of the solution composition given in the carrier fabrication method C above so as to provide a thickness of 3 μm. The interlayer was formed on the glossy surface side of the electrolytic copper foil.

Carrier Fabrication Method E (Example 9)

A titanium rotary drum (electrolytic drum) was prepared. The surface of the electrolytic drum was ground under specific electrolytic drum surface control conditions with an abrasive wheel grinding material of a grain size #1000 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.
Electrolytic Solution Composition
Copper: 80 to 110 g/L
Sulfuric acid: 70 to 110 g/L
Chlorine: 10 to 100 mass ppm
Fabrication Conditions
Current density: 50 to 200 A/dm$^2$
Electrolytic solution temperature: 40 to 70° C.
Electrolytic solution linear velocity: 3 to 5 m/sec
Electrolysis time: 0.5 to 10 min The copper deposited on the surface of the rotating electrolytic drum was scraped off, and used as the carrier after performing a surface treatment on the glossy surface side with a hydrogen peroxide/sulfuric acid-based etchant. The surface treatment was performed by spray etching under the following conditions.
Spray Etching Conditions
Type of etching: Spray etching
Spray nozzle: Full cone nozzle
Spray pressure: 0.10 MPa
Etchant temperature: 30° C.
Etchant composition:
Additive: a composition containing 10 w/v % of hydrogen peroxide and 2 w/v % of sulfuric acid, prepared by adding a predetermined amount of sulfuric acid to a 4× diluted solution of CPB-38 (manufactured by Mitsubishi Gas Chemical, Inc.; 35.0 w/w % (40 w/v %) hydrogen peroxide, and 3.0 w/w % (3.5 w/v %) sulfuric acid).

The interlayer was formed on the glossy surface side of the electrolytic copper foil.

Carrier Fabrication Method F (Example 10)

A copper ingot of a composition containing 1,200 wt ppm of Sn added to JIS-H3100 oxygen-free copper was produced, and subjected to hot rolling at 800 to 900° C. Annealing and cold rolling was then repeated once in a 300 to 700° C. continuous annealing line to obtain a 1 to 2 mm-thick rolled plate. The rolled plate was annealed in a 600 to 800° C. continuous annealing line to recrystallize, and subjected to the final cold rolling at the rolling reduction of 95 to 99.7% until the thickness became 7 to 50 μm. The resulting rolled copper foil was used as the carrier.

Here, the oil film equivalent was adjusted to 23,000 for both the final path of the final cold rolling, and the path immediately before the final path of final cold rolling. The oil film equivalent is represented by the following formula.

(Oil film equivalent)={(rolling oil viscosity;kinetic viscosity at 40° C.;cSt)×(rolling velocity;m/min)}/{(yield stress of material;kg/mm$^2$)×(roll bite angle;rad)}

Carrier Fabrication Method G (Example 12)

A titanium rotary drum (electrolytic drum) was prepared. The surface of the electrolytic drum was ground under specific electrolytic drum surface control conditions with an abrasive wheel grinding material of a grain size #1500 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.
Electrolytic Solution Composition
Copper: 80 to 110 g/L
Sulfuric acid: 70 to 110 g/L
Chlorine: 10 to 100 mass ppm
Fabrication Conditions
Current density: 50 to 200 A/dm$^2$
Electrolytic solution temperature: 40 to 70° C.
Electrolytic solution linear velocity: 3 to 5 m/sec
Electrolysis time: 0.5 to 10 min The copper deposited on the surface of the rotating electrolytic drum was scraped off, and used as the carrier. The interlayer was formed on the glossy surface side of the electrolytic copper foil.

Carrier Fabrication Method H (Examples 13 to 24)

A titanium rotary drum (electrolytic drum) was prepared. The surface of the electrolytic drum was ground under specific electrolytic drum surface control conditions with an abrasive wheel grinding material of a grain size #1000 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.
Electrolytic Solution Composition
Copper: 80 to 110 g/L
Sulfuric acid: 70 to 110 g/L
Chlorine: 10 to 100 mass ppm
Fabrication Conditions
Current density: 50 to 200 A/dm$^2$
Electrolytic solution temperature: 40 to 70° C.
Electrolytic solution linear velocity: 3 to 5 m/sec
Electrolysis time: 0.5 to 10 min The copper deposited on the surface of the rotating electrolytic drum was scraped off, and used as the carrier. The interlayer was formed on the glossy surface side of the electrolytic copper foil.

Carrier Fabrication Method I (Comparative Example 2)

A titanium rotary drum (electrolytic drum) was prepared. The surface of the electrolytic drum was ground under specific electrolytic drum surface control conditions with an abrasive wheel grinding material of a grain size F500 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.
Electrolytic Solution Composition
    Copper: 80 to 110 g/L
    Sulfuric acid: 70 to 110 g/L
    Chlorine: 10 to 100 mass ppm
Fabrication Conditions
    Current density: 50 to 200 A/dm$^2$
    Electrolytic solution temperature: 40 to 70° C.
    Electrolytic solution linear velocity: 3 to 5 m/sec
    Electrolysis time: 0.5 to 10 min
The copper deposited on the surface of the rotating electrolytic drum was scraped off, and used as the carrier. The interlayer was formed on the glossy surface side of the electrolytic copper foil.

Carrier Fabrication Method J (Comparative Example 3)

A titanium rotary drum (electrolytic drum) was prepared. The surface of the electrolytic drum was ground under specific electrolytic drum surface control conditions with an abrasive wheel grinding material of a grain size F320 at a grinding stone rotation speed of 500 rpm. The electrolytic drum and electrodes were disposed inside an electrolysis vessel. The electrodes were disposed around the drum with a predetermined distance in between. Electrolysis was performed in the electrolysis vessel under the following conditions, whereby copper was deposited on the electrolytic drum surface while rotating the electrolytic drum.
Electrolytic Solution Composition
    Copper: 80 to 110 g/L
    Sulfuric acid: 70 to 110 g/L
    Chlorine: 10 to 100 mass ppm
Fabrication Conditions
    Current density: 50 to 200 A/dm$^2$
    Electrolytic solution temperature: 40 to 70° C.
    Electrolytic solution linear velocity: 3 to 5 m/sec
    Electrolysis time: 0.5 to 10 min
The copper deposited on the surface of the rotating electrolytic drum was scraped off, and used as the carrier. The interlayer was formed on the glossy surface side of the electrolytic copper foil.

Carrier Fabrication Method K (Comparative Example 4)

The electrolytic copper foil was fabricated with the electrolytic solution below. The interlayer was formed on the matte surface side of the electrolytic copper foil (the depositing surface side; the surface opposite the drum side)
Electrolytic Solution Composition
    Copper: 70 to 130 g/L
    Sulfuric acid: 70 to 130 g/L
    Chlorine: 30 to 100 ppm
    Glue: 0.05 to 3 ppm
Fabrication Conditions
    Current density: 70 to 100 A/dm$^2$
    Electrolytic solution temperature: 50 to 60° C.
    Electrolytic solution linear velocity: 3 to 5 m/sec
    Electrolysis time: 0.5 to 10 min (2) Formation of Interlayer
In Examples 1 to 3, and Comparative Examples 1 and 5, a 50 nm-thick nickel sputtered film was formed, and electroplated in a roll-to-roll continuous plating line in a electrolytic chromate treatment in which a Cr layer was deposited on the nickel sputtered film in a deposit amount of 11 μg/dm$^2$ under the following conditions.
Electrolytic Chromate Treatment
    Solution composition: potassium dichromate 1 to 10 g/L, zinc 0 to 5 g/L
    pH: 3 to 4
    Liquid temperature: 50 to 60° C.
    Current density: 0.1 to 2.6 A/dm$^2$
    Coulomb quantity: 0.5 to 30 As/dm$^2$
In Example 4, a 3 μm-thick super gloss nickel plating (manufactured by Okuno Chemical Industries Co., Ltd.; additive: Super Neolite) was formed, and electroplated in a roll-to-roll continuous plating line in a electrolytic chromate treatment in which a Cr layer was deposited on the nickel sputtered film in a deposit amount of 11 μg/dm$^2$ under the following conditions.
Electrolytic Chromate Treatment
    Solution composition: potassium dichromate 1 to 10 g/L, zinc 0 to 5 g/L
    pH: 3 to 4
    Liquid temperature: 50 to 60° C.
    Current density: 0.1 to 2.6 A/dm$^2$
    Coulomb quantity: 0.5 to 30 As/dm$^2$
The interlayer was formed under the following conditions in Examples 5 to 14, 17 to 24, and Comparative Examples 2 to 4.
A Ni layer was formed in a deposit amount of 4,000 μg/dm$^2$ by performing electroplating in a roll-to-roll continuous plating line under the following conditions.
Ni Layer
    Nickel sulfate: 250 to 300 g/L
    Nickel chloride: 35 to 45 g/L
    Nickel acetate: 10 to 20 g/L
    Trisodium citrate: 15 to 30 g/L
    Gloss agent: saccharin, butynediol, etc.
    Sodium dodecyl sulfate: 30 to 100 ppm
    pH: 4 to 6
    Bath temperature: 50 to 70° C.
    Current density: 3 to 15 A/dm$^2$
After water washing and acid washing, a Cr layer was attached to the Ni layer in a deposit amount of 11 μg/dm$^2$ on the roll-to-roll continuous plating line by performing an electrolytic chromate treatment under the following conditions.
Electrolytic Chromate Treatment
    Solution composition: potassium dichromate 1 to 10 g/L, zinc 0 to 5 g/L
    pH: 3 to 4
    Liquid temperature: 50 to 60° C.
    Current density: 0.1 to 2.6 A/dm$^2$
    Coulomb quantity: 0.5 to 30 As/dm$^2$
In Example 15, the interlayer was formed under the following conditions.
A Ni—Mo layer was formed in a deposit amount of 3,000 μg/dm$^2$ by performing electroplating in a roll-to-roll continuous plating line under the following conditions.
Ni—Mo Layer (Nickel-Molybdenum Alloy Plating)
    Solution composition: nickel sulfate hexahydrate: 50 g/dm$^3$, sodium molybdate dihydrate: 60 g/dm$^3$, sodium citrate: 90 g/dm$^3$ Liquid temperature: 30° C.
Current density: 1 to 4 A/dm$^2$
Energization time: 3 to 25 s In Example 16, the interlayer was formed under the following conditions.

Ni Layer

The Ni layer was formed under the same conditions used in Example 1.

Organic Material Layer (Organic Material Layer Forming Process)

After water washing and acid washing the surface of the Ni layer, an aqueous solution having a liquid temperature of 40° C. and pH 5, and containing 1 to 30 g/L of carboxybenzotriazole (CBTA) was showered onto the Ni layer surface for 20 to 120 sunder the conditions below to form an organic material layer.

(3) Formation of Ultrathin Copper Layer

After forming the interlayer, an ultrathin copper layer was formed on the interlayer in thicknesses of 1, 2, 3, and 5 μm to form a carrier-attached copper foil by performing electroplating under the following conditions.

Ultrathin Copper Layer
  Copper concentration: 30 to 120 g/L
  $H_2SO_4$ concentration: 20 to 120 g/L
  Chlorine: 50 to 100 ppm
  Leveling agent 1 (bis(3-sulfopropyl)disulfide): 10 to 30 ppm
  Leveling agent 2 (amine compound): 10 to 30 ppm The amine compound used had the following chemical formula.

$$\text{(1)}$$

[Chemical structure of amine compound with OH, CH$_2$, CH, N, R$_1$, R$_2$ groups]

In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.

Electrolytic solution temperature: 20 to 80° C.
Current density: 10 to 100 A/dm$^2$ (4) Formation of Surface Treatment Layer The roughening treatment layer was provided on the ultrathin copper layer under any of the following conditions, as summarized in Table 1.

Roughening Condition a
Solution Composition
  Cu: 10 to 20 g/L
  Co: 1 to 10 g/L
  Ni: 1 to 10 g/L
  pH: 1 to 4
  Liquid temperature: 50 to 60° C.
  Current density Dk: 30 to 40 A/dm$^2$
  Time: 0.2 to 1 s The gravimetrically measured thickness of the roughening treatment layer was adjusted within a 0.05 μm±0.02 μm range.

The gravimetrically measured thickness of the roughening treatment layer was calculated as follows.

Gravimetrically measured thickness of roughening treatment layer(μm)=((sample weight after roughening treatment(g))−(sample weight before roughening treatment(g)))/(copper density 8.94 (g/cm$^3$)×(flat surface area of sample with roughening treatment layer)(cm$^2$))×10,000(μm/cm)

Roughening Condition b
Solution Composition
  Cu: 10 to 20 g/L
  Co: 1 to 10 g/L
  Ni: 1 to 10 g/L
  pH: 1 to 4
  Liquid temperature: 50 to 60° C.
  Current density Dk: 20 to 30 A/dm$^2$
  Time: 1 to 3 s The gravimetrically measured thickness of the roughening treatment layer was adjusted within a 0.15 μm±0.04 μm range.

Roughening Condition c
Solution Composition
  Cu: 10 to 20 g/L
  Co: 1 to 10 g/L
  Ni: 1 to 10 g/L
  pH: 1 to 4
  Liquid temperature: 40 to 50° C.
  Current density Dk: 20 to 30 A/dm$^2$
  Time: 5 to 8 s The gravimetrically measured thickness of the roughening treatment layer was adjusted within a 0.25 μm±0.05 μm range.

Roughening Condition d

Roughening treatment 1 and roughening treatment 2 were performed in series, in this order.

(1) Roughening Treatment 1
Solution composition: Cu: 10 to 20 g/L, $H_2SO_4$: 50 to 100 g/L
  Liquid temperature: 25 to 50° C.
  Current density: 0.5 to 54 A/dm$^2$
  Coulomb quantity: 2 to 67 As/dm$^2$ (2) Roughening Treatment 2
Solution composition: Cu: 10 to 20 g/L, Ni: 5 to 15 g/L, Co: 5 to 15 g/L
  pH: 2 to 3
  Liquid temperature: 30 to 50° C.
  Current density: 20 to 46 A/dm$^2$
  Coulomb quantity: 31 to 45 As/dm$^2$ The gravimetrically measured total thickness of the roughening treatment layer after roughening treatment 1 and roughening treatment 2 was adjusted within a 0.35 μm±0.05 μm range.

Roughening Condition e

Roughening treatment 1 and roughening treatment 2 were performed in series, in this order.
(1) Roughening Treatment 1
Solution Composition 1
  Cu: 15 to 35 g/L
  $H_2SO_4$: 10 to 150 g/L
  W: 10 to 50 mg/L
  Sodium dodecyl sulfate: 10 to 50 mg/L
  As: 50 to 200 mg/L
Electroplating Condition 1
  Temperature: 30 to 70° C.
  Current density: 30 to 115 A/dm$^2$
  Roughening coulomb quantity: 20 to 450 As/dm$^2$
  Plating time: 0.5 to 15 s
(2) Roughening Treatment 2
Solution Composition 2
  Cu: 20 to 80 g/L
  $H_2SO_4$: 50 to 200 g/L
Electroplating Condition 2
  Temperature: 30 to 70° C.
  Current density: 3 to 48 A/dm$^2$
  Roughening coulomb quantity: 20 to 250 As/dm$^2$
  Plating time: 1 to 50 s The gravimetrically measured total thickness of the roughening treatment layer after roughening treatment 1 and roughening treatment 2 was adjusted within a 0.40 μm±0.05 μm range.

Roughening Condition f

Roughening treatment 1 and roughening treatment 2 were performed in series, in this order.
(1) Roughening Treatment 1
Solution Composition 1
  Cu: 15 to 35 g/L
  $H_2SO_4$: 10 to 150 g/L
  W: 1 to 50 mg/L
  Sodium dodecyl sulfate: 1 to 50 mg/L
  As: 1 to 200 mg/L
Electroplating Condition 1
  Temperature: 30 to 70° C.
  Current density: 20 to 105 A/dm$^2$
  Roughening coulomb quantity: 50 to 500 As/dm$^2$
  Plating time: 0.5 to 20 s
(2) Roughening Treatment 2
Solution Composition 2
  Cu: 20 to 80 g/L
  $H_2SO_4$: 50 to 200 g/L
Electroplating Condition 2
  Temperature: 30 to 70° C.
  Current density: 3 to 48 A/dm$^2$
  Roughening coulomb quantity: 50 to 300 As/dm$^2$
  Plating time: 1 to 60 s The gravimetrically measured total thickness of the roughening treatment layer after roughening treatment 1 and roughening treatment 2 was adjusted within a 0.50 μm±0.05 μm range.

Roughening Condition g

Roughening treatment 1 and roughening treatment 2 were performed in series, in this order.
(1) Roughening Treatment 1
Solution Composition 1
  Cu: 10 to 40 g/L
  $H_2SO_4$: 10 to 150 g/L Electroplating Condition 1
  Temperature: 30 to 70° C.
  Current density: 24 to 112 A/dm$^2$
  Roughening coulomb quantity: 70 to 600 As/dm$^2$
  Plating time: 5 to 30 s
(2) Roughening Treatment 2
Solution Composition 2
  Cu: 30 to 90 g/L
  $H_2SO_4$: 50 to 200 g/L
Electroplating Condition 2
  Temperature: 30 to 70° C.
  Current density: 4 to 49 A/dm$^2$
  Roughening coulomb quantity: 70 to 400 As/dm$^2$
  Plating time: 5 to 65 s The gravimetrically measured total thickness of the roughening treatment layer after roughening treatment 1 and roughening treatment 2 was adjusted within a 0.60 μm±0.05 μm range.

Roughening Condition h
Solution Composition
  Cu: 10 to 20 g/L
  Co: 5 to 20 g/L
  Ni: 5 to 20 g/L
  pH: 1 to 4
  Liquid temperature: 50 to 60° C.
  Current density Dk: 30 to 40 A/dm$^2$
  Time: 0.05 to 0.2 s The gravimetrically measured thickness of the roughening treatment layer was adjusted within a 0.02 μm±0.02 μm range.

The gravimetrically measured thickness of the roughening treatment layer was calculated as follows.

$$\text{Gravimetrically measured thickness of roughening treatment layer(μm)} = ((\text{sample weight after roughening treatment(g)}) - (\text{sample weight before roughening treatment(g)}))/(\text{copper density } 8.94 \text{ (g/cm}^3) \times (\text{flat surface area of sample with roughening treatment layer)(cm}^2)) \times 10{,}000 (\text{μm/cm})$$

In Examples 2, 4, 6, 10, 13, and 20, a heat resistant treatment layer, a chromate layer, and a silane coupling process layer were provided on the roughening treatment layer under the following conditions.

Heat Resistant Treatment
  Zn: 0 to 20 g/L
  Ni: 0 to 5 g/L
  pH: 3.5
  Temperature: 40° C.
  Current density Dk: 0 to 1.7 A/dm$^2$
  Time: 1 s
  Zn deposit amount: 5 to 250 μg/dm$^2$
  Ni deposit amount: 5 to 300 μg/dm$^2$
Chromate Treatment
  $K_2Cr_2O_7$ ($Na_2Cr_2O_7$ or $CrO_3$): 2 to 10 g/L
  NaOH or KOH: 10 to 50 g/L
  ZnO or $ZnSO_4 7H_2O$: 0.05 to 10 g/L
  pH: 7 to 13
  Bath temperature: 20 to 80° C.
  Current density: 0.05 to 5 A/dm$^2$
  Time: 5 to 30 s
  Cr deposit amount: 10 to 150 μg/dm$^2$
Silane Coupling Process
  Vinyltriethoxysilane aqueous solution (vinyltriethoxysilane concentration: 0.1 to 1.4 wt %)
  pH: 4 to 5
  Time: 5 to 30 s The carrier-attached copper foils obtained in Examples 1 to 24, and in Comparative Examples 1 to 5 above were evaluated as follows.

Thickness of Ultrathin Copper Layer

The thickness of the ultrathin copper layer was measured by using a gravimetric method, as follows.

After measuring the weight of the carrier-attached copper foil before providing the surface treatment layer on the ultrathin copper layer, the ultrathin copper layer was peeled off, and the carrier weight was measured. The difference between the two measured weights was defined as the weight of the ultrathin copper layer.

Sample size: A 10 cm×10 cm sheet (a 10 cm×10 cm sheet punched with a pressing machine)

Sample collection: Arbitrarily chosen three locations

The gravimetric thickness of the ultrathin copper layer was calculated for each sample, using the following formula.

$$\text{Gravimetric thickness of ultrathin copper layer}(\mu m) = \{(\text{weight of the carrier-attached copper foil of a 10 cm} \times 10 \text{ cm sheet}(g/100 \text{ cm}^2)) - (\text{carrier weight after the ultrathin copper layer was peeled off from the carrier-attached copper foil of the 10 cm} \times 10 \text{ cm sheet}(g/100 \text{ cm}^2))\}/\text{copper density}(8.96 \text{ g/cm}^3) \times 0.01(100 \text{ cm}^2/\text{cm}^2) \times 10{,}000 \, \mu m/cm$$

A four decimal place precision balance was used for the sample weight measurement. The measured weight value was directly used for the calculation above.

The arithmetic mean value of the ultrathin copper layer thicknesses measured at three locations by using a gravimetric method was used as the gravimetric thickness of the ultrathin copper layer.

A precision balance IBA-200 (manufactured by As One Corporation), and a pressing machine HAP-12 (manufactured by Noguchi Press Co., Ltd.) were used.

It was confirmed that the ultrathin copper layers had a thickness of 1 to 5 μm in all of Examples 1 to 24 and Comparative Examples 1 to 5.

Gravimetrically Measured Thickness (D1) of Carrier-Attached Copper Foil Excluding Carrier and Interlayer The carrier-attached copper foil after the provision of the surface treatment layer on the ultrathin copper layer was measured for gravimetrically measured thickness (D1) excluding the carrier and the interlayer, using the same gravimetric thickness measurement method described in the "Thickness of Ultrathin Copper Layer" section above.

Specifically, the gravimetrically measured thickness (D1) of each sample was calculated according to the following formula.

$$\text{Gravimetrically measured thickness of carrier-attached copper foil excluding carrier and interlayer}(\mu m) = \{(\text{weight of the carrier-attached copper foil of a 10 cm} \times 10 \text{ cm sheet after the provision of surface treatment layer}(g/100 \text{ cm}^2)) - (\text{carrier weight after the ultrathin copper layer with surface treatment layer was peeled off from the carrier-attached copper foil of the 10 cm} \times 10 \text{ cm sheet}(g/100 \text{ cm}^2))\}/\text{copper density}(8.96 \text{ g/cm}^3) \times 0.01(100 \text{ cm}^2/\text{cm}^2) \times 10{,}000 \, \mu m/cm$$

The gravimetrically measured thickness (D1) takes the same value as the ultrathin copper layer thickness when the carrier-attached copper foil does not have the surface treatment layer. The carrier weight after the ultrathin copper layer with surface treatment layer was peeled off from the carrier-attached copper foil of the 10 cm×10 cm sheet (g/100 cm²) includes the weight of the interlayer remaining on the carrier after the ultrathin copper layer with the surface treatment layer was peeled off from the carrier-attached copper foil.

Maximum Thickness (D2) of Layer Remaining on Resin Substrate—Gravimetrically Measured Thickness (D1)

The carrier-attached copper foils of Examples and Comparative Examples (carrier-attached copper foils after a surface treatment when the ultrathin copper layer is subjected to a surface treatment) were each laminated to a prepreg (bismaleimide-triazine resin substrate) by being heat pressed against the prepreg from the ultrathin copper layer side under the pressure of 20 kgf/cm² at 220° C. for 2 h. The carrier was then detached from the carrier-attached copper foil, and the maximum thickness (D2) of the layer remaining on the prepreg was measured by observing a SIM (scanning ion microscope) image with a focused ion beam.

Figure 6:
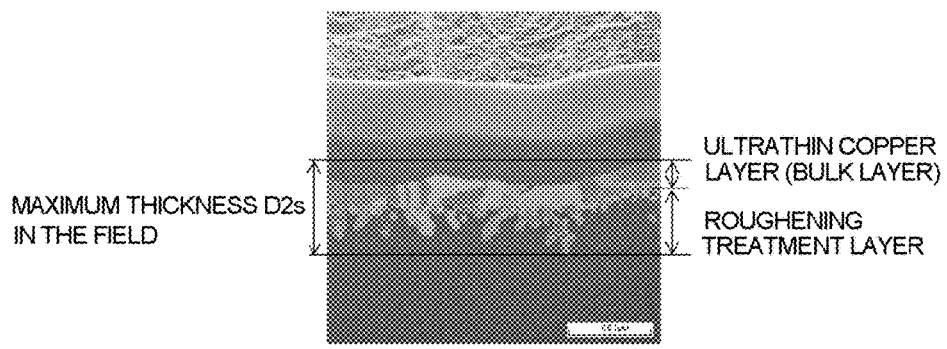
FIG. 6 shows an example of a SIM image used to find the maximum thickness D2 of the layer remaining on a resin substrate.

FIG. 6 shows an example of the SIM image. As shown in the SIM image of FIG. 6, D2 is the maximum value of the height difference between the highest point and the lowest point of the layer remaining on the prepreg (the thickness of the thickest portion) as observed relative to a horizontal plane (horizontal line) in a cross section parallel to thickness direction and TD direction (carrier width direction) after the carrier is detached. Here, the horizontal plane (horizontal line) is a direction (line) parallel to the lower frame of the SIM image or the display showing the SIM image.

The sample is first observed at a magnification at which 100 μm of the sample length is observable in a direction parallel to the lower frame of the image or the display, and the sample position is adjusted by adjusting the sample stage position to make the sample parallel to the lower frame of the image or the display. The sample is then visually inspected, and a portion where the layer remaining on the prepreg appears to have a large maximum thickness (D2s) is observed at a larger magnification. The magnified field covers a length of 8 μm in a horizontal direction (a direction perpendicular to thickness direction, and parallel to TD direction) of the SEM image as shown in FIG. 6, and includes the ultrathin copper layer, and the surface treatment layer when it is provided.

The field is observed, and the maximum thickness (D2s) of the layer remaining on the prepreg after the carrier detachment is measured, as shown in FIG. 6. The measurement was made for 10 fields, and the maximum value of the measured D2s values in these 10 fields was obtained as the maximum thickness D2 of the layer remaining on the resin substrate in case of detaching the carrier after the carrier-attached copper foil is laminated to the bismaleimide-triazine resin substrate from the ultrathin copper layer side by being heat pressed under a pressure of 20 kgf/cm² at 220° C. for 2 hours. The difference between the maximum thickness (D2) of the layer remaining on the resin substrate and the gravimetrically measured thickness (D1) was then calculated.

Circuit Formability: Evaluation of Circuit Skirt Portion after Formation of M-SAP Circuit The carrier-attached copper foil (carrier-attached copper foil after a surface treatment when the ultrathin copper layer is subjected to a surface treatment) was laminated to a bismaleimide triazine resin substrate form the ultrathin copper layer side. After detaching the carrier, a patterned copper plating layer was formed on the exposed surface of the ultrathin copper layer in a width of 15 μm at L/S=12 μm/12 lam. This was performed by half etching the ultrathin copper layer surface to a thickness of 1 μm when the ultrathin copper layer had a thickness of 5 μm, 3 μm, or 2 μm. Half etching was not performed when the ultrathin copper layer had a thickness of 1 µm. This was followed by etching to form an M-SAP circuit.

The etching was performed under the following conditions. The circuit plane was observed at 100 locations where the line length was 1 mm (100 circuit lines with a 1-mm line length), and the length of the skirt portion was measured. Circuit formability was evaluated according to the following criteria with regard to the measured maximum length of the circuit skirt portion. FIG. 5 shows a photograph of an observed circuit plane showing a skirt portion. The skirt portion is a thin etching residue occurring at the bottom of the circuit, as shown in FIG. 5.

The maximum length of skirt portion was 0.5 µm or more and less than 2 µm: Excellent The maximum length of skirt portion was less than 0.5 µm: Outstanding Evaluation of Copper Foil Resin Adhesion The M-SAP circuit formed in the foregoing Section "Circuit Formability: Evaluation of Circuit Skirt Portion After Formation of M-SAP Circuit" was evaluated by observing 100 circuit lines with a line length of 1 mm. The circuit was "Poor" when peeling or separation was observed even in a single line of the circuit, and "Good" when peeling or separation was not observed at all in the circuit.

The test conditions, and the test results are presented in Table 1.

TABLE 1

| Level | Foil fabrication conditions | | | D1 Gravimetrically measured thickness of carrier-attached copper foil excluding carrier and interlayer (µm) | D2 Maximum thickness (µm) | D2 − D1 Difference (µm) | M-SAP circuit formability | Copper foil resin adhesion |
|---|---|---|---|---|---|---|---|---|
| | Carrier fabrication condition | Ultrathin copper layer thickness (µm) | Roughing Condition | | | | | |
| Ex. 1 | A | 2 | a | 2.05 | 2.35 | 0.30 | Outstanding | Good |
| Ex. 2 | A | 2 | b | 2.15 | 2.61 | 0.46 | Outstanding | Good |
| Ex. 3 | A | 2 | c | 2.25 | 2.94 | 0.69 | Outstanding | Good |
| Ex. 4 | B | 2 | b | 2.15 | 2.79 | 0.64 | Outstanding | Good |
| Ex. 5 | C | 2 | a | 2.05 | 3.44 | 1.39 | Excellent | Good |
| Ex. 6 | C | 2 | b | 2.15 | 3.77 | 1.62 | Excellent | Good |
| Ex. 7 | C | 2 | c | 2.25 | 4.00 | 1.75 | Excellent | Good |
| Ex. 8 | D | 2 | b | 2.15 | 4.54 | 2.39 | Excellent | Good |
| Ex. 9 | E | 2 | b | 2.15 | 4.84 | 2.69 | Excellent | Good |
| Ex. 10 | F | 2 | b | 2.15 | 4.58 | 2.43 | Excellent | Good |
| Ex. 11 | B | 2 | b | 2.15 | 4.04 | 1.89 | Excellent | Good |
| Ex. 12 | G | 2 | b | 2.15 | 4.69 | 2.54 | Excellent | Good |
| Ex. 13 | H | 2 | a | 2.05 | 4.12 | 2.07 | Excellent | Good |
| Ex. 14 | H | 2 | b | 2.15 | 5.09 | 2.94 | Good | Good |
| Ex. 15 | H | 2 | b | 2.15 | 5.09 | 2.94 | Good | Good |
| Ex. 16 | H | 2 | b | 2.15 | 5.11 | 2.96 | Good | Good |
| Ex. 17 | H | 1 | b | 1.15 | 4.69 | 3.54 | Good | Good |
| Ex. 18 | H | 3 | b | 3.15 | 5.75 | 2.60 | Good | Good |
| Ex. 19 | H | 5 | b | 5.15 | 7.12 | 1.97 | Excellent | Good |
| Ex. 20 | H | 2 | c | 2.25 | 5.41 | 3.16 | Good | Good |
| Ex. 21 | H | 2 | d | 2.35 | 5.74 | 3.39 | Good | Good |
| Ex. 22 | H | 2 | e | 2.40 | 6.23 | 3.83 | Good | Good |
| Ex. 23 | H | 2 | f | 2.50 | 6.31 | 3.81 | Good | Good |
| Ex. 24 | H | 2 | g | 2.60 | 6.05 | 3.45 | Good | Good |
| Com. Ex. 1 | A | 2 | Untreated | 2.00 | 2.15 | 0.15 | Outstanding | Poor |
| Com. Ex. 2 | I | 2 | b | 2.15 | 6.11 | 3.96 | Poor | Good |
| Com. Ex. 3 | J | 2 | b | 2.15 | 7.63 | 5.48 | Poor | Good |
| Com. Ex. 4 | K | 2 | b | 2.15 | 10.65 | 8.50 | Bad | Good |
| Com. Ex. 5 | A | 2 | h | 2.02 | 2.18 | 0.16 | Outstanding | Poor |

Etching Conditions
  Type of etching: Spray etching
  Spray nozzle: Full cone nozzle
  Spray pressure: 0.10 MPa
  Etchant temperature: 30° C.
  Etchant composition:
    $H_2O_2$: 18 g/L
    $H_2SO_4$: 92 g/L
    Cu: 8 g/L
    Additive: FE-830IIW3C (manufactured by JCU), used in an appropriate amount
Evaluation Criteria of Circuit Formability
  Defective circuit formation, including multiple shorting between wires, and multiple breaking: Bad
  The maximum length of skirt portion was 5 µm or more, but shorting between wires did not occur: Poor
  The maximum length of skirt portion was 2 µm or more and less than 5 µm: Good

What is claimed is:

1. A carrier-attached copper foil comprising a carrier, an interlayer, and an ultrathin copper layer in this order, wherein D2−D1 is 0.30 to 3.83 µm, where D1 is the gravimetrically measured thickness of the carrier-attached copper foil excluding the carrier and the interlayer, and D2 is the maximum thickness of a layer remaining on a bismaleimide-triazine resin substrate in case of detaching the carrier after the carrier-attached copper foil is laminated to the resin substrate from the ultrathin copper layer side by being heat pressed under a pressure of 20 kgf/cm$^2$ at 220° C. for 2 hours.

2. The carrier-attached copper foil according to claim 1, wherein the difference D2−D1 is 0.30 to 3.50 µm.

3. The carrier-attached copper foil according to claim 2, wherein the difference D2−D1 is 0.30 to 2.80 µm.

4. The carrier-attached copper foil according to claim 3, wherein the difference D2−D1 is 0.30 to 2.58 µm.

5. The carrier-attached copper foil according to claim 4, wherein the difference D2−D1 is 0.30 to 1.20 μm.

6. The carrier-attached copper foil according to claim 1, which comprises one or more layers selected from the group consisting of a roughening treatment layer, a heat-resistant layer, an antirust layer, a chromate treatment layer, and a silane coupling process layer, said one or more layers being provided on one or both of the surfaces on the side of the ultrathin copper layer and on the side of the carrier when the carrier-attached copper foil of claim 1 has the interlayer and the ultrathin copper layer in this order seen from the carrier, on one side of the surfaces of the carrier, said one or more layers being provided on one or both surfaces on the ultrathin copper layer side when the carrier-attached copper foil of claim 1 has the interlayer and the ultrathin copper layer in this order seen from the carrier, on both surfaces of the carrier.

7. The carrier-attached copper foil according to claim 3, which comprises one or more layers selected from the group consisting of a roughening treatment layer, a heat-resistant layer, an antirust layer, a chromate treatment layer, and a silane coupling process layer, said one or more layers being provided on one or both of the surfaces on the side of the ultrathin copper layer and on the side of the carrier when the carrier-attached copper foil of claim 3 has the interlayer and the ultrathin copper layer in this order seen from the carrier, on one side of the surfaces of the carrier, said one or more layers being provided on one or both surfaces on the ultrathin copper layer side when the carrier-attached copper foil of claim 3 has the interlayer and the ultrathin copper layer in this order seen from the carrier, on both surfaces of the carrier.

8. The carrier-attached copper foil according to claim 4, which comprises one or more layers selected from the group consisting of a roughening treatment layer, a heat-resistant layer, an antirust layer, a chromate treatment layer, and a silane coupling process layer, said one or more layers being provided on one or both of the surfaces on the side of the ultrathin copper layer and on the side of the carrier when the carrier-attached copper foil of claim 4 has the interlayer and the ultrathin copper layer in this order seen from the carrier, on one side of the surfaces of the carrier, said one or more layers being provided on one or both surfaces on the ultrathin copper layer side when the carrier-attached copper foil of claim 4 has the interlayer and the ultrathin copper layer in this order seen from the carrier, on both surfaces of the carrier.

9. The carrier-attached copper foil according to claim 6, wherein the roughening treatment layer is a layer comprised of a simple substance selected from the group consisting of copper, nickel, phosphorous, tungsten, arsenic, molybdenum, chromium, iron, vanadium, cobalt, and zinc, or an alloy containing one or more simple substances selected from the group consisting of copper, nickel, phosphorous, tungsten, arsenic, molybdenum, chromium, iron, vanadium, cobalt, and zinc.

10. The carrier-attached copper foil according to claim 1, which comprises a resin layer on the ultrathin copper layer.

11. The carrier-attached copper foil according to claim 6, wherein a resin layer is provided on one or more layers selected from the group consisting of a roughening treatment layer, a heat-resistant layer, an antirust layer, a chromate treatment layer, and a silane coupling process layer.

12. The carrier-attached copper foil according to claim 7, wherein a resin layer is provided on one or more layers selected from the group consisting of a roughening treatment layer, a heat-resistant layer, an antirust layer, a chromate treatment layer, and a silane coupling process layer.

13. The carrier-attached copper foil according to claim 8, wherein a resin layer is provided on one or more layers selected from the group consisting of a roughening treatment layer, a heat-resistant layer, an antirust layer, a chromate treatment layer, and a silane coupling process layer.

14. A laminate produced by using the carrier-attached copper foil of claim 1.

15. A laminate comprising the carrier-attached copper foil of claim 1, and a resin, wherein the resin covers end surfaces of the carrier-attached copper foil either in part or as a whole.

16. A laminate comprising a first carrier-attached copper foil laminated from the carrier side or the ultrathin copper layer side to the carrier side or the ultrathin copper layer side of a second carrier-attached copper foil, the first and the second carrier-attached copper foils being the carrier-attached copper foil of claim 1.

17. A method for producing a printed wiring board using the laminate of claim 14.

18. A method for producing a printed wiring board, the method comprising:
providing a dual layer of resin layer and circuit at least once on one side or both sides of the laminate of claim 14; and
detaching the ultrathin copper layer or the carrier from the carrier-attached copper foil included in the laminate after the dual layer of resin layer and circuit is formed at least once.

19. A method for producing a printed wiring board by using the carrier-attached copper foil of claim 1.

20. A method for producing an electronic device by using a printed wiring board produced by using the method of claim 19.

21. A method for producing a printed wiring board, the method comprising:
preparing the carrier-attached copper foil of claim 1, and an insulating substrate;
laminating the carrier-attached copper foil and the insulating substrate to each other;
forming a copper-clad laminated board by detaching the carrier of the carrier-attached copper foil after the carrier-attached copper foil and the insulating substrate are laminated to each other; and
forming a circuit by using any of a semi-additive process, a subtractive process, a partly additive process, and a modified semi-additive process.

22. A method for producing a printed wiring board, the method comprising:
forming a circuit on the surface of the carrier-attached copper foil of claim 1 on the side of the ultrathin copper layer or on the side of the carrier;
forming a resin layer on the ultrathin copper layer- or carrier-side surface of the carrier-attached copper foil so as to make the circuit embedded in the resin layer;
detaching the carrier or the ultrathin copper layer; and
removing the ultrathin copper layer or the carrier after detaching the carrier or the ultrathin copper layer to expose the circuit formed on the ultrathin copper layer- or carrier-side surface and embedded in the resin layer.

23. A method for producing a printed wiring board, the method comprising:
laminating the surface of the carrier-attached copper foil of claim 1 to a resin substrate on the side of the ultrathin copper layer, or on the side of the carrier;
providing a dual layer of resin layer and circuit at least once on the ultrathin copper layer- or carrier-side surface of the carrier-attached copper foil opposite the surface laminated to the resin substrate; and
detaching the carrier or the ultrathin copper layer from the carrier-attached copper foil after the formation of the dual layer of resin layer and circuit.

* * * * *